United States Patent
Müller et al.

(10) Patent No.: US 11,950,430 B2
(45) Date of Patent: Apr. 2, 2024

(54) MEMORY CELL, CAPACITIVE MEMORY STRUCTURE, AND METHODS THEREOF

(71) Applicant: Ferroelectric Memory GmbH, Dresden (DE)

(72) Inventors: Stefan Ferdinand Müller, Dresden (DE); Patrick Polakowski, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 0 days.

(21) Appl. No.: 17/085,141

(22) Filed: Oct. 30, 2020

(65) Prior Publication Data
US 2022/0139937 A1    May 5, 2022

(51) Int. Cl.
*H10B 53/30* (2023.01)
*H01L 49/02* (2006.01)

(52) U.S. Cl.
CPC .......... *H10B 53/30* (2023.02); *H01L 28/56* (2013.01); *H01L 28/57* (2013.01); *H01L 28/65* (2013.01); *H01L 28/84* (2013.01)

(58) Field of Classification Search
None
See application file for complete search history.

(56) References Cited

U.S. PATENT DOCUMENTS

| | | | |
|---|---|---|---|
| 5,719,520 A | 2/1998 | Au | |
| 5,963,805 A * | 10/1999 | Kang | H01L 28/84 438/398 |
| 6,479,862 B1 | 11/2002 | King | |
| 6,559,459 B2 | 5/2003 | Paz De Araujo | |
| 6,559,469 B1 * | 5/2003 | Paz de Araujo | C23C 16/448 257/17 |
| 7,709,359 B2 | 5/2010 | Boescke | |

(Continued)

FOREIGN PATENT DOCUMENTS

| | | |
|---|---|---|
| CN | 106537509 A | 3/2017 |
| CN | 113948114 A | 1/2021 |

(Continued)

OTHER PUBLICATIONS

Massoud Pedram, "Leakage Power Modeling and Minimization". University of Southern California, Dept. of EE Systems, Los Angeles, CA 90089, ICCAD 2004 Tutorial, www.ceng.usc.edu, Oct. 10, 2007, 43 pages.

(Continued)

*Primary Examiner* — Steven M Christopher
(74) *Attorney, Agent, or Firm* — Black McCuskey

(57) ABSTRACT

According to various aspects, a memory cell is provided, the memory cell including: a first electrode; a second electrode; and a memory structure disposed between the first electrode and the second electrode, the first electrode, the second electrode, and the memory structure forming a memory capacitor, wherein at least one of the first electrode or the second electrode includes: a first electrode layer including a first material having a first microstructure; a functional layer in direct contact with the first electrode layer; and a second electrode layer in direct contact with the functional layer, the second electrode layer including a second material having a second microstructure different from the first microstructure.

18 Claims, 10 Drawing Sheets

(56) References Cited

U.S. PATENT DOCUMENTS

| | | | |
|---|---|---|---|
| 8,304,823 | B2 | 11/2012 | Boeschke |
| 9,053,802 | B2 | 6/2015 | Muller |
| 9,558,804 | B2 | 1/2017 | Muller |
| 9,608,111 | B2 | 3/2017 | Ramaswamy |
| 10,438,645 | B2* | 10/2019 | Müller ............... G11C 11/223 |
| 10,460,788 | B2 | 10/2019 | Müller |
| 10,622,051 | B2 | 4/2020 | Müller |
| 10,650,892 | B2 | 5/2020 | Noack |
| 10,978,129 | B1 | 4/2021 | Muller |
| 11,024,357 | B1 | 6/2021 | Mizusaki |
| 11,049,541 | B2 | 6/2021 | Muller |
| 11,081,159 | B1* | 8/2021 | Jähne ............... G11C 11/223 |
| 11,101,291 | B2 | 8/2021 | Mennenga |
| 11,158,361 | B2 | 10/2021 | Muller |
| 11,189,331 | B1* | 11/2021 | Benoist ............ H01L 29/40111 |
| 11,195,589 | B1 | 12/2021 | Ocker |
| 11,289,145 | B2 | 3/2022 | Ocker |
| 11,309,034 | B2 | 4/2022 | Mennenga |
| 11,309,792 | B2 | 4/2022 | Iqbal |
| 11,309,793 | B2 | 4/2022 | Iqbal |
| 11,335,391 | B1 | 5/2022 | Ocker |
| 2001/0051436 | A1 | 12/2001 | Kim |
| 2004/0129987 | A1 | 7/2004 | Uchiyama |
| 2005/0088878 | A1 | 4/2005 | Eshel |
| 2010/0085806 | A1 | 4/2010 | Wang |
| 2010/0258794 | A1 | 10/2010 | Iwasaki |
| 2011/0169135 | A1* | 7/2011 | Nakao ............... H01L 28/82 257/532 |
| 2014/0254275 | A1 | 9/2014 | Shuto |
| 2014/0355328 | A1 | 12/2014 | Muller |
| 2015/0014813 | A1* | 1/2015 | Mueller ............... H01L 29/94 257/532 |
| 2015/0340372 | A1 | 11/2015 | Pandey |
| 2016/0005961 | A1 | 1/2016 | Ino |
| 2016/0268271 | A1 | 9/2016 | Mueller |
| 2017/0076775 | A1 | 3/2017 | Mueller |
| 2017/0154999 | A1 | 6/2017 | Ramaswamy |
| 2017/0207225 | A1* | 7/2017 | Mueller ............ H01L 29/78391 |
| 2018/0166453 | A1 | 6/2018 | Müller |
| 2018/0226417 | A1* | 8/2018 | Ando ............... H01L 27/092 |
| 2019/0129992 | A1 | 5/2019 | Ewen |
| 2019/0130957 | A1 | 5/2019 | Muller |
| 2019/0131347 | A1 | 5/2019 | Lee |
| 2019/0273087 | A1 | 9/2019 | Morris |
| 2020/0176610 | A1 | 6/2020 | Lee |
| 2020/0357455 | A1 | 11/2020 | Noack |
| 2020/0357470 | A1 | 11/2020 | Noack |
| 2021/0026601 | A1 | 1/2021 | Kobayashi |
| 2021/0028180 | A1 | 1/2021 | Yamaguchi |
| 2021/0036100 | A1* | 2/2021 | Lu ............... H01G 4/306 |
| 2021/0091097 | A1 | 3/2021 | Mennenga |
| 2021/0312969 | A1 | 10/2021 | Noack |
| 2021/0327901 | A1 | 10/2021 | Noack |
| 2021/0391457 | A1* | 12/2021 | Zaka ............... H01L 29/788 |
| 2022/0020776 | A1 | 1/2022 | Mennenga |
| 2022/0122995 | A1 | 4/2022 | Ocker |
| 2022/0122996 | A1 | 4/2022 | Ocker |
| 2022/0122999 | A1 | 4/2022 | Polakowski |
| 2022/0139931 | A1 | 5/2022 | Ocker |
| 2022/0139932 | A1 | 5/2022 | Polakowski |
| 2022/0139933 | A1 | 5/2022 | Noack |
| 2022/0139934 | A1 | 5/2022 | Muller |
| 2022/0139936 | A1 | 5/2022 | Ocker |
| 2022/0139937 | A1 | 5/2022 | Muller |

FOREIGN PATENT DOCUMENTS

| | | |
|---|---|---|
| CN | 113539319 A | 10/2021 |
| CN | 113948115 A | 1/2022 |
| CN | 113948494 A | 1/2022 |
| CN | 113948581 A | 1/2022 |
| DE | 120008024519 B4 | 12/2009 |
| EP | 1134803 A1 | 9/2001 |
| EP | 1143525 A1 | 10/2001 |
| EP | 3701562 A1 | 9/2020 |
| IN | 113496720 A | 10/2021 |
| JP | H1168057 A | 3/1999 |
| TW | 201917870 A | 5/2019 |
| TW | 201944411 A | 11/2019 |
| WO | 2001071816 A1 | 9/2001 |
| WO | 2019081117 A1 | 5/2019 |
| WO | 2019206619 A1 | 10/2019 |
| WO | 20190206619 A1 | 10/2019 |
| WO | 2021140193 A1 | 7/2021 |
| WO | 20220083898 A1 | 4/2022 |

OTHER PUBLICATIONS

Junction Leakage and Gidl, "Reserve Biased Diode Current (Junction Leakage)", https://asicsos.blogspot.com/20018/04/reverse-biased-diode-current-junction.html last viewed on Jul. 15, 2020 3 pages.

Jan M. Rabaey, Anantha Chandrakasan and Borivoje Nikoloc, "Digital integrated Circuits A Design Perspective", 2nd Edition, dated 2005, Prentice Hall, 448 pages (in 3 parts).

BSIM4.2.1 Mosfet Model, Department of Electrical Engineering and Computer Sciences University of California, Berkeley, dated 2001, 1 page.

Subthreshold Conduction, Mar. 21, 2020, p. 1.

Bruyere S. et al., "Review on high-K Dielectrics Reliability Issues", IEEE Transactions on Device and Materials Reliability, IEEE Service Center, vol. 5, No. 1, dated Mar. 1, 2005 pp. 5-19.

Tilke et al., highly Scalable Embedded Flash Memory with Deep Trench Isolation and Novel Buried Bitline Integration for the 90-nm Node and Beyond, IEEE, vol. 54 No. 7, dated Jul. 2007.

Shum et al., "Highly Scalable Flash Memory Embedded into High-Performance CMOS for the 90 nm Node & beyond", ICSICT_2006, Shanghai, China, 4 pages.

Shum et al., "Highly Scalable Flash Memory with Novel Deep Trench Isolation Embedded into High-Performance CMOS for the 90nm Node & Beyond", dated 2005 IEEE, 4 pages.

TW 107135787, office action dated Aug. 15, 2019,in the Chinese language.

English translation of TW 107135787, office action dated Aug. 15, 2019.

TW 107135787, Notice of Allowance, dated Jan. 7, 2020, in the Chinese language.

PCT/EP2018/074611, Written Opinion of the International Searching Authority dated Nov. 12, 2018.

PCT/EP2021/050261, Written Opinion of the International Searching Authority dated Mar. 9, 2021.

PCT/EP2021/057968, Written Opinion of the International Searching Authority dated Dec. 15, 2021.

PCT/EP2018/074611, International Search Report dated Nov. 12, 2018.

PCT/EP2021/050261, International Search Report dated Mar. 9, 2021.

PCT/EP2021/057968, International Search Report dated Dec. 15, 2021.

\* cited by examiner

US 11,950,430 B2

MEMORY CELL, CAPACITIVE MEMORY STRUCTURE, AND METHODS THEREOF

TECHNICAL FIELD

Various aspects relate to a memory cell and methods thereof, e.g. a method for processing a memory cell.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner. The memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
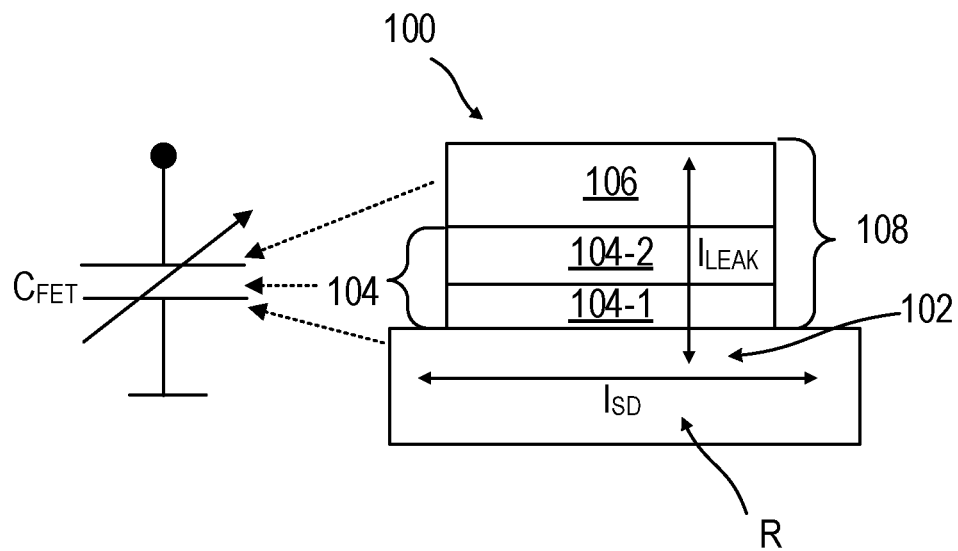
FIG. 1 shows schematically a field-effect transistor structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive memory structure (also referred to herein as memory capacitor) coupled to a gate electrode of the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (FeCAP) coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. A ferroelectric material may turn a ferroelectric capacitor structure into a non-volatile capacitor based memory structure, e.g. by controlling the amount of charge stored in the capacitor structure. In other aspects, a non-volatile memory technology may be based on at least one capacitive memory structure. The capacitive memory structure may be or may include a ferroelectric capacitor structure. The amount of charge stored in the capacitive memory structure may be read out by suitable electronic read out circuits, e.g., by a charge to voltage converter, by a determination of a switching current of the capacitive memory structure.

A ferroelectric field-effect transistor (FeFET) based memory cell may include two components, a transistor and a ferroelectric capacitor (FeCAP). Increasing FeFET performance may include one or more adjustments of the FeCAP layer stack. The FeCAP layer stack may include different materials, which may be adapted to increase ferroelectricity and reduce parasitic effects. A reduction of the FeCAP layer stack leakage by modification of electrode materials as well as electrode crystallographic structure may be implemented, in some aspects, to induce different crystallographic behavior in the ferroelectric material.

FIG. 1 shows a schematic functioning of a field-effect transistor structure 100, according to various aspects. The field-effect transistor structure 100 may include a gate structure 108, wherein the gate structure 108 may include a gate isolation 104 and a gate electrode 106. The gate structure 108 is illustrated exemplarily as a planar gate stack; however, it may be understood that the planar configuration shown in FIG. 1 is an example, and other field-effect transistor designs may include a gate structure 108 with a non-planar shape, for example a trench gate transistor design, a vertical field-effect transistor design, or other designs as exemplarily shown in FIG. 3D and FIG. 3E, as examples. The gate structure 108 may define a channel region 102, e.g., provided in a semiconductor portion (e.g., in a semiconductor layer, in a semiconductor die, etc.). The gate structure 108 may allow for a control of an electrical behavior of the channel region 102. The gate structure 108 may, for example, be used to control (e.g., allow or prevent) a current flow in the channel region 102. In some aspects, the gate structure 108 may, for example, allow to control (e.g., allow or prevent) a source/drain current, $I_{SD}$, from a first source/drain region of the field-effect transistor structure 100 to a second source/drain region of the field-effect transistor structure 100 (the source/drains are provided in or adjacent to the channel but are not shown in FIG. 1). The channel region 102 and the source/drain regions may be formed, e.g., via doping one or more semiconductor materials or by the use of intrinsically doped semiconductor materials, within a layer and/or over a layer. In some aspects, the gate structure 108 may control (e.g., increase or reduce) an electrical resistance, R, of the channel region 102 and, accordingly, control the amount of current that may flow through the channel region 102. With respect to the operation of the field-effect transistor structure 100, a voltage (illustratively an electrical potential) may be provided at (e.g., supplied to) the gate electrode 106 to control the current flow, $I_{SD}$, in the channel region 102, the current flow, $I_{SD}$, in the channel region 102 being caused by voltages supplied via the source/drain regions.

The gate electrode 106 may include an electrically conductive material, for example, polysilicon, aluminum, etc. In some aspects, the gate electrode 106 may include any suitable electrically conductive material, e.g., a metal, a metal alloy, a degenerate semiconductor (in other words a semiconductor material having such a high level of doping that the material acts like a metal and not anymore as a semiconductor). According to various aspects, the gate electrode 106 may include one or more electrically conductive portions, layers, etc. The gate electrode 106 may include, for example, one or more metal layers (also referred to as a metal gate), one or more polysilicon layers (also referred to as poly-Si-gate), etc. A metal gate may include, for example, at least one work-function adaption metal layer disposed over the gate isolation 104 and an additional metal layer disposed over the work-function adaption metal layer. A poly-Si-gate may be, for example, p-type doped or n-type doped.

According to various aspects, the gate isolation 104 may be configured to provide an electrical separation of the gate electrode 106 from the channel region 102 and further to influence the channel region 102 via an electric field generated by the gate electrode 106. The gate isolation 104 may include one or more electrically insulating portions, layers, etc., as described in more detail below.

Some designs of the gate isolation 104 may include at least two layers including different materials, e.g., a first gate isolation layer 104-1 (e.g., a first dielectric layer including a first dielectric material) and a second gate isolation layer 104-2 (e.g., a second dielectric layer including a second dielectric material distinct from first dielectric material). The second gate isolation layer 104-2 may be disposed over the first gate isolation layer 104-1. Illustratively, the first gate isolation layer 104-1 may be disposed closer to the channel region 102 of the field-effect transistor structure 100 with respect to the second gate isolation layer 104-2. The first gate isolation layer 104-1 may be disposed directly on the channel region 102 and may provide an interface for forming the second gate isolation layer 104-2. In some aspects, the first gate isolation layer 104-1 may be referred to as buffer layer.

As illustrated by the circuit equivalent in FIG. 1, a first capacitance, $C_{FET}$, may be associated with the field-effect transistor structure 100. Illustratively, the channel region 102, the gate isolation 104, and the gate electrode 106 may have a capacitance, $C_{FET}$, associated therewith, originating from the more or less conductive regions (the channel region 102 and the gate electrode 106) separated from one another by the gate isolation 104. Further illustratively, the channel region 102 may be considered as a first capacitor electrode, the gate electrode 106 as a second capacitor electrode, and the gate isolation 104 as a dielectric medium between the two capacitor electrodes. The capacitance, $C_{FET}$, of the field-effect transistor structure 100 may define one or more operating properties of the field-effect transistor structure 100. The configuration of the field-effect transistor structure 100 (e.g., of the gate isolation 104) may be adapted according to a desired behavior or application of the field-effect transistor structure 100 during operation (e.g., according to a desired capacitance), as described in further detail below.

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

According to various embodiments, a memory cell may be provided, for example, by coupling a gate of a field-effect transistor structure with a capacitive memory structure, or by integrating a memory structure in the gate structure of a field-effect transistor structure (as shown, for example, in FIG. 2 and FIG. 3A to FIG. 3E).

The influence of the capacitance of a field-effect transistor structure on the performance of a memory cell including a capacitive memory structure are described in further detail below.

Figure 2:
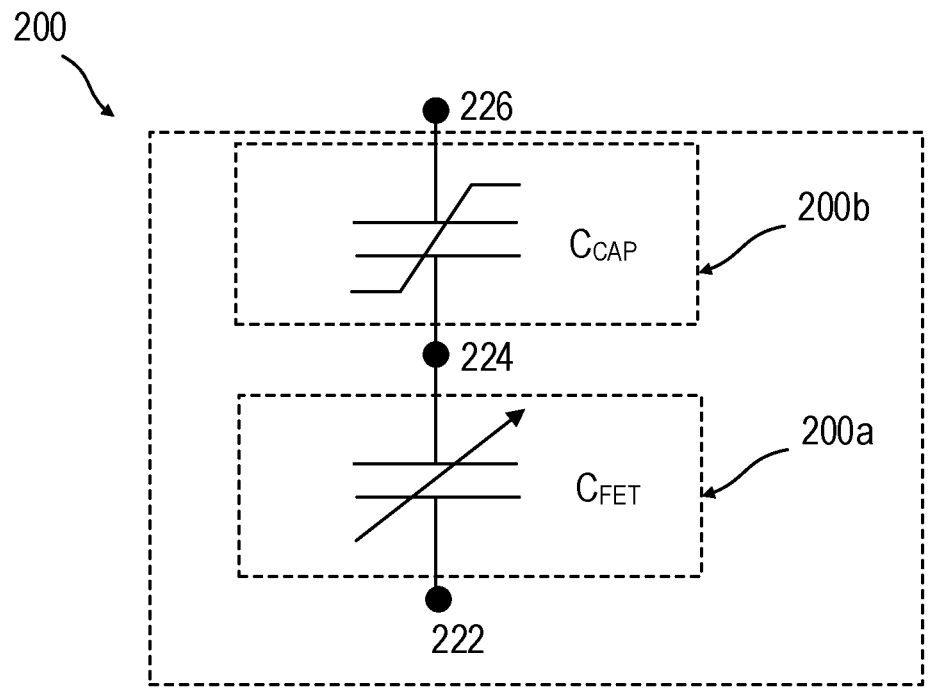
FIG. 2 shows schematically an equivalent circuit diagram of a memory cell, according to various aspects.

FIG. 2 shows a circuit equivalent of a memory cell 200 including a field-effect transistor structure 200a (e.g., configured as described here with reference to the field-effect transistor structure 100) and a capacitive memory structure 200b, according to various aspects. The field-effect transistor (FET) structure 200a may have a first capacitance, $C_{FET}$, associated therewith and the capacitive memory structure 200b may have a second capacitance, $C_{CAP}$, associated therewith. The field-effect transistor structure 200a and the capacitive memory structure 200b may be coupled (e.g., electrically connected) to one another such that a capacitive voltage divider is provided. The channel or bulk node of the field-effect transistor structure 200a may provide or may be connected to a first node 222, an electrode of the capacitive memory structure 200b may provide or may be connected to a second node 226, and an intermediate conductive portion (electrode, layer, etc.) may provide or may be connected to a floating intermediate node 224. Exemplary realizations of such connected structures will be described in further detail below, for example in relation to FIG. 3A to FIG. 3E.

The capacitive voltage divider formed by the field-effect transistor structure 200a and the capacitive memory structure 200b may allow adapting the capacitances $C_{FET}$, $C_{CAP}$ of the respective capacitors to allow an efficient programming of the capacitive memory structure 200b. The overall gate voltage required for switching the memory cell 200 from one memory state into another memory state (e.g. from high threshold voltage state to low threshold voltage state, as described below), may become smaller in case the voltage distribution across the field-effect transistor structure 200a and the capacitive memory structure 200b is adapted such that more of the applied gate voltage drops across the memory layer of the capacitive memory structure 200b (e.g., across a remanent-polarizable layer, such as a ferroelectric layer) than across the gate isolation of the field-effect transistor structure 200a. The overall write voltage (illustratively, applied via the nodes 222, 226 to which the field-effect transistor structure 200a and the capacitive memory structure 200b are connected) may thus be reduced by adapting the capacitive voltage divider. The voltage distribution may be determined by voltage divider calculations for a series connection of the capacitors.

That is, in case the capacitance, $C_{FET}$, of the field-effect transistor structure 200a is adapted (e.g., by providing a suitable gate isolation) a predefined fraction of the voltage applied to the series connection may drop across the capacitive memory structure 200b. Accordingly, the electric field generated across the gate isolation of the field-effect transistor structure 200a underneath the capacitive memory structure 200b could be reduced if desired. This may lead to a reduced interfacial field stress, which may lead to a reduced wear out of the interface due to, for example, charge injection. Therefore, the reduced electric field generated across the gate isolation may lead to improved endurance characteristics of the memory cell 200, that is, to an increased amount of possible polarization reversals until the memory cell 200 may lose or change its memory properties.

In some aspects, the memory layer of the capacitive memory structure 200b may be a remanent-polarizable layer. By increasing the capacitance $C_{FET}$ of the field-effect transistor structure 200a (e.g., by providing a gate isolation including a relatively thick layer of material with high dielectric constant), the depolarization field, $E_{Dep}$, of the remanent-polarizable layer may be reduced. The depolarization field may be expressed by the following set of equations, wherein the indices "FET" refer to the capacitor provided by the field-effect transistor structure 200a and the indices "CAP" refer to the capacitor provided by the capacitive memory structure 200b, as described herein:

$$V_{FET} + V_{CAP} = 0,$$

$$D = \varepsilon_0 \varepsilon_{FET} E_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer. However, the magnitude may be reduced by increasing the capacitance ratio $C_{FET}/C_{CAP}$. Accordingly, in case the capacitance $C_{FET}$ of the field-effect transistor structure 200a is increased, the depolarization field is reduced. This in turn improves the data retention of the memory cell 200.

In a first approximation, the voltage which drops across the memory structure capacitor, $V_{CAP}$, may be estimated by:

$$V_{CAP} = V_{226} \cdot \frac{C_{FET}}{C_{FET} + C_{CAP}},$$

wherein $V_{226}$ represents the voltage applied to the top node 226 (e.g., to a top electrode of the capacitive memory structure 200b, for example assuming that the node 222 associated with the bulk of the field-effect transistor structure 200a is connected to a base potential, e.g. to ground or 0 V) and the capacitances in general are defined as described above. Suitable parameters for influencing the voltage drop across the capacitive memory structure 200b (e.g., across the ferroelectric capacitor) may be represented by the area ratio between the capacitive memory structure 200b and the field-effect transistor structure 200a, and/or by the relative permittivity of the field-effect transistor structure 200a (e.g., of the gate isolation of the field-effect transistor structure 200a). In some aspects, adapting the capacitance $C_{FET}$ of the field-effect transistor structure 200a to adjust the gate voltage divider may allow keeping the thickness of the layer (e.g., the memory layer, e.g., a remanent-polarizable layer, e.g., a spontaneously-polarizable layer) of the capacitive memory structure 200b in a predefined range.

FIG. 3A to FIG. 3E illustrate schematically possible realizations of a respective memory cell 300a, 300b, 300c, 300d, 300e. These memory cells 300a, 300b, 300c, 300d, 300e may be configured such that a field-effect transistor structure 302a and a capacitive memory structure 302b of the respective memory cell 300a, 300b, 300c, 300d, 300e are connected to form a capacitive voltage divider $C_{FET}/C_{CAP}$, as described with reference to the memory cell 200 in FIG. 2. Each of the described memory cells 300a, 300b, 300c, 300d, 300e may include a field-effect transistor structure 302a including a channel 304 (also referred to herein as channel region 304), a gate isolation 306, and a gate electrode 308. The channel 304, the gate isolation 306, and the gate electrode 308 may be configured as described above, e.g., with reference to channel 102, the gate isolation 104, and the gate electrode 106 of the field-effect transistor structure 100. In some aspects, the gate isolation 306 may include a first gate isolation layer 306a and a second gate isolation layer 306b. In other aspects, the gate isolation 306 may include a single gate isolation layer, i.e. one of the two gate isolation layers 306a, 306b may be omitted. The gate isolation 306 may extend from the channel region 304 to the gate electrode 308.

In some aspects, the first gate isolation layer 306a may be in direct physical contact with the channel region 304. The second gate isolation layer 306b may be in direct physical contact with the first gate isolation layer 306a and with the gate electrode 308 of the field-effect transistor structure 302a.

Each of the described memory cells 300a, 300b, 300c, 300d, 300e may include a capacitive memory structure 302b electrically connected (in other words, electrically coupled) with the field-effect transistor structure 302a. The capacitive memory structure 302b may include any type of planar or non-planar design with at least a first electrode 322, a second electrode 326 and at least one memory structure 324 disposed between the first electrode 322 and the second electrode 326, e.g. to provide memory functions. The memory structure 324 may be or may include one or more memory layers, e.g., one or more remanent-polarizable layers. However, the memory structure 324 may include other implementations of memory materials or memory structures, e.g., an anti-ferroelectric layer coupled (e.g., disposed directly on) to a charge storage layer. The charge storage layer may include any material suitable to store charge (e.g., by trapping).

Figure 3A:
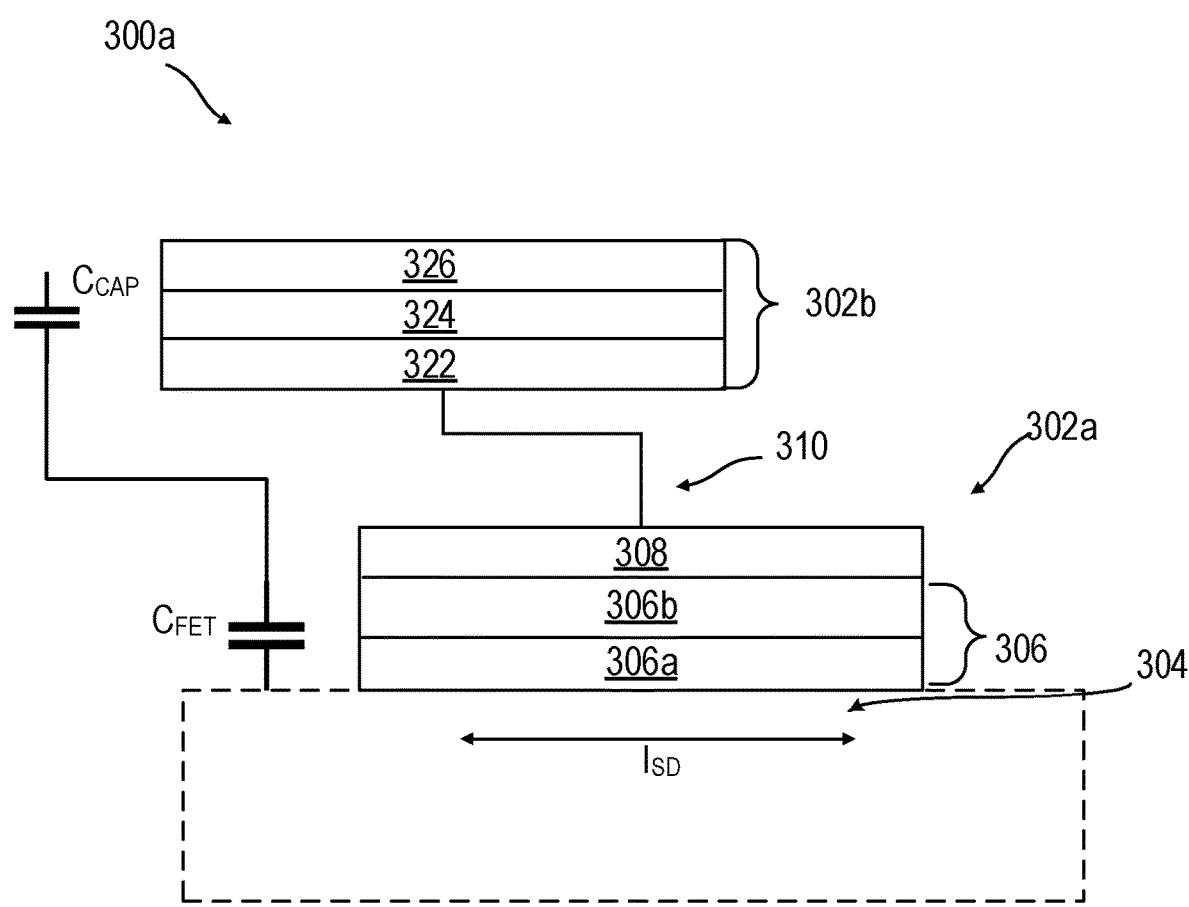
FIG. 3A to FIG. 3E each shows schematically a memory cell, according to various aspects.

As described above with reference to the memory cell 200 in FIG. 2, the field-effect transistor structure 302a and the capacitive memory structure 302b may be connected to form a capacitive voltage divider $C_{FET}/C_{CAP}$, e.g., by connecting one of the electrodes of the capacitive memory structure 302b (e.g., the first electrode 322) with the gate electrode 308 of the field-effect transistor structure 302a, as shown for example in FIG. 3A. The electrically conductive connection of the capacitive memory structure 302b with the field-effect transistor structure 302a (e.g., of the first electrode 322 with the gate electrode 308) may provide a series capacitive connection between the capacitors formed by the capacitive memory structure 302b and the field-effect transistor structure 302a. In a planar configuration, the first electrode 322 of the capacitive memory structure 302b may be a first capacitor electrode, the second electrode 326 may be a second capacitor electrode, and the at least one memory structure 324 may be a dielectric medium between the first electrode and the second capacitor electrode.

In some aspects, the gate electrode 308 of the field-effect transistor structure 302a may be electrically conductively connected to the first electrode 322 of the capacitive memory structure 302b via an electrically conductive (e.g., ohmic) connection 310, as shown in FIG. 3A. In some aspects, the first electrode 322 of the capacitive memory structure 302b may be in direct physical contact with the gate electrode 308 of the field-effect transistor structure 302a.

Figure 3B:
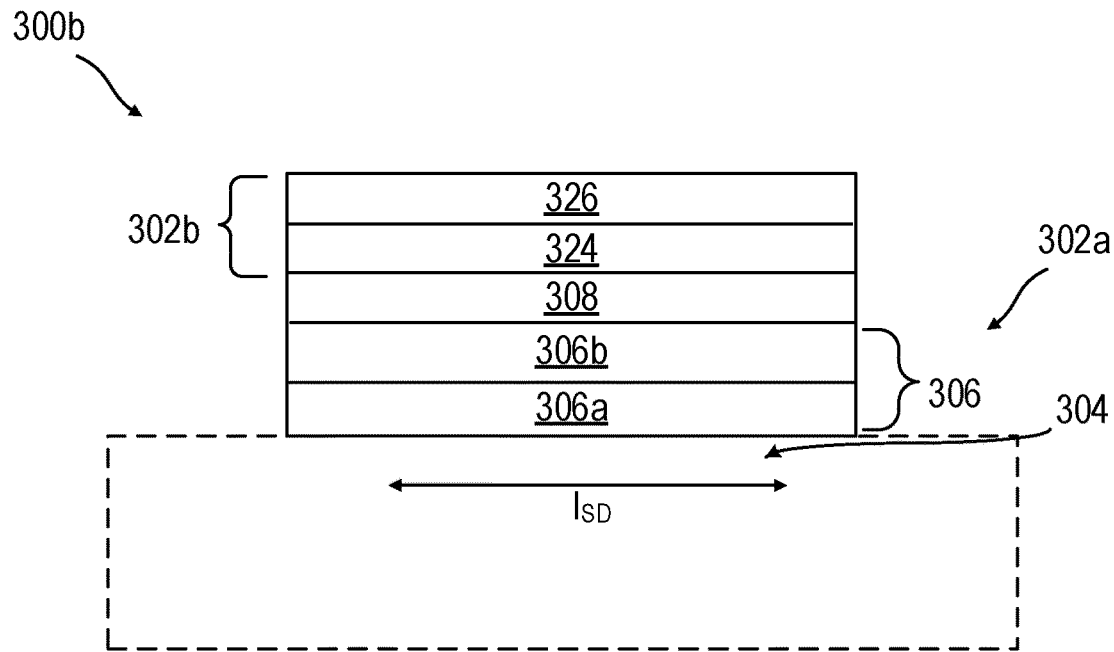

In some aspects, the capacitive memory structure 302b and the field-effect transistor structure 302a may share a common electrode acting as gate electrode of the field-effect transistor structure 302a and as electrode of the capacitive memory structure 302b, as shown in FIG. 3B.

Figure 3C:
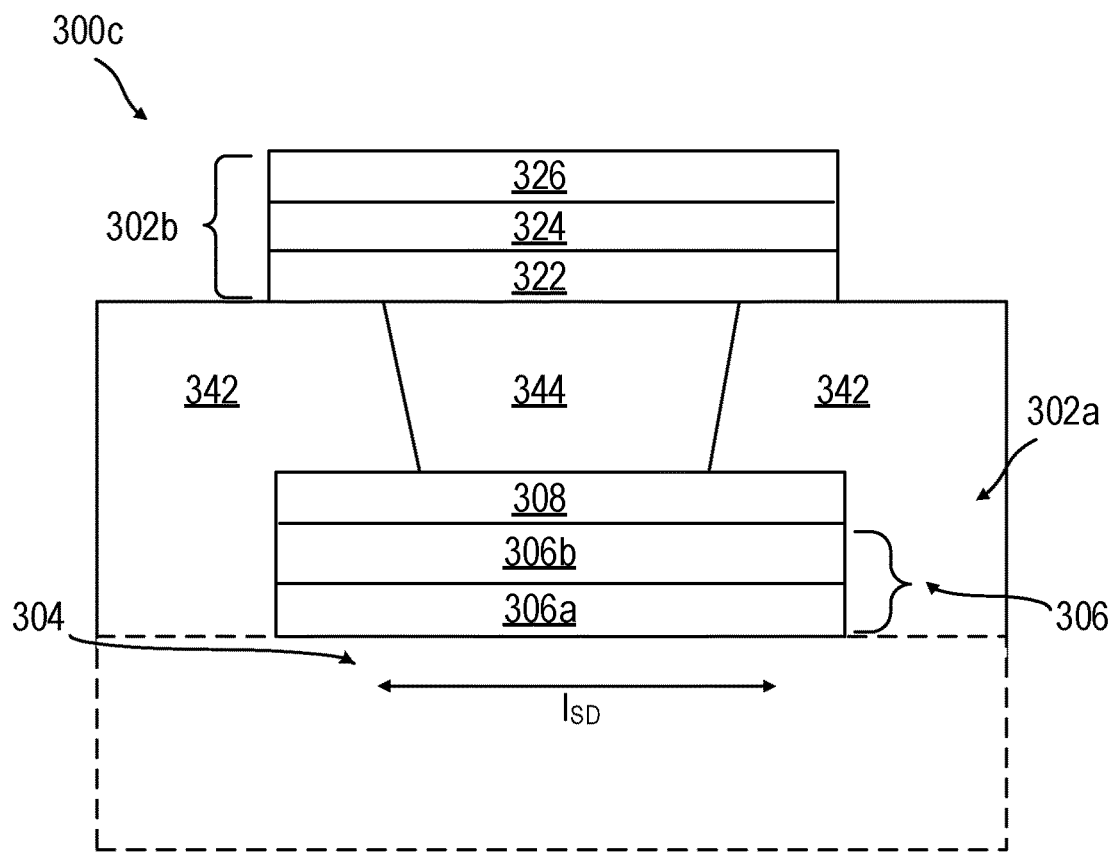

In some aspects, the electrically conductive (e.g., ohmic) connection 310 between the field-effect transistor structure 302a and the capacitive memory structure 302b may be provided by one or more metallization structures disposed over the field-effect transistor structure 302a, as shown in FIG. 3C.

The at least one memory structure 324 may include any type of remanent-polarizable and/or spontaneously-polarizable material, e.g., a ferroelectric material, an anti-ferroelectric material, an anti-ferroelectric-like material, etc. The at least one memory structure 324 may be the memory layer of the capacitive memory structure 302b to store, for example, an information via at least two remanent polarization states of the at least one memory structure 324. The programming of the capacitive memory structure 302b (illustratively the storage of information therein) may be carried out by providing an electric field between the first electrode 322 and the second electrode 326 (e.g., an electric potential difference between a first node and a second node associated with the first electrode 322 and the second electrode 326, respectively, as described in relation to FIG. 2) to thereby set or change the remanent polarization state of the at least one memory structure 324. As an example, a voltage may be provided between the top electrode 326 and the bulk region of the field-effect transistor structure 302a.

It may be understood that a memory structure 324 is only an example of a possible memory layer of the capacitive memory structure 302b, and any other memory layer whose state may be altered by an electric field provided across the capacitive memory structure 302b may be used. In some aspects, a material of the memory structure 324 may include hafnium and/or zirconium.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

According to various aspects, a ferroelectric material may be used as part of a capacitive memory structure of a memory cell (e.g., as part of the capacitive memory structure 302b of a memory cell 300a, 300b, 300c, 300d, 300e, or of the capacitive memory structure 200b of the memory cell 200). A ferroelectric material may be an example of material of a remanent-polarizable layer (e.g., of the memory structure 324). Illustratively, ferroelectric materials may be used to store data in non-volatile manner in integrated circuits. The term "ferroelectric" may be used herein, for example, to describe a material that shows a hysteretic charge voltage relationship (Q-V). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

According to various aspects, a memory cell (e.g., a memory cell 200, 300a, 300b, 300c, 300d, 300e), may have at least two distinct states associated therewith, for example with two distinct electrical conductivities or two distinct amounts of stored charge that may be determined to determine in which of the at least two distinct states the memory cell is residing in. According to various aspects, a memory state the memory cell is residing may be a "programmed state" or an "erased state". As an example, the programmed state may be an electrically conducting state or a state with positive stored charge (e.g., associated with a logic "1") and the erased state may be an electrically non-conducting state or a state with negative stored charge (e.g., associated with a logic "0"). However, the definition of programmed state and erased state may be selected arbitrarily.

According to various aspects, the residual polarization of the remanent-polarizable layer may define the memory state a memory cell is residing in. The polarization state of the remanent-polarizable layer may be switched by means of the capacitive memory structure. The polarization state of the remanent-polarizable layer may also be read out by means of the capacitive memory structure. According to various aspects, a memory cell may reside in a first memory state in the case that the remanent-polarizable layer is in a first polarization state, and the memory cell may reside in a second memory state in the case that the remanent-polarizable layer is in a second polarization state (e.g., opposite to the first polarization state). As an example, the polarization state of the remanent-polarizable layer may determine the amount of charge stored in the capacitive memory structure. The amount of charge stored in the capacitive memory structure may be used to define a memory state of the memory cell. The threshold voltage of a field-effect transistor structure (e.g., the field-effect transistor structure 200a, the field-effect transistor structure 302a) may be a function of the amount and/or polarity of charge stored in the capacitive memory structure, e.g. on the polarization state of the remanent-polarizable layer. A first threshold voltage, e.g. a high threshold voltage $V_{H-th}$, may be associated with the first polarization state (e.g., with the first amount and/or polarity of stored charge), and a second threshold voltage, e.g. a low threshold voltage $V_{L-th}$, may be associated with the second polarization state (e.g., with the second amount and/or polarity of stored charge). Illustratively, the first memory state may be associated with the first threshold voltage, and the second memory state may be associated with the second threshold voltage.

According to various aspects, the second gate isolation layer 306b of the gate isolation 306 of the field-effect transistor structure 302a may be a layer different from a memory layer of the capacitive memory structure 302b (e.g., different from the memory structure 324), e.g. different in at least one of the type of material(s) or the remanent-polarizable properties of the material(s). By way of example, the material of the second gate isolation layer 306b may not possess remanent-polarizable properties, e.g. it may not possess ferroelectric properties.

According to various aspects, the semiconductor portion (illustratively, where the channel region 304 may be formed), may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In various aspects, the semiconductor portion may be a wafer made of silicon (e.g. p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

FIG. 3C shows an exemplary integration scheme for a memory cell 300c in a schematic view, according to various aspects, in which a metallization structure is provided to electrically connect the field-effect transistor structure 302a to the capacitive memory structure 302b. It may be understood that the metallization structure may include a plurality of metallization structures, e.g. a plurality of single- or multi-level contact structures.

The metallization structure may be configured to electrically conductively connect the gate electrode 308 of the field-effect transistor structure 302a and the first electrode 322 of the capacitive memory structure 302b with one another. As an example, the metallization structure may include a contact metallization. The contact metallization may be at least partially disposed between the field-effect transistor structure 302a and the capacitive memory structure 302b. As another example, the metallization structure may include a contact metallization and a single- or multi-level metallization disposed over the contact metallization. In this case, both the contact metallization and at least one level of the single- or multi-level metallization may be disposed between the field-effect transistor structure 302a and the capacitive memory structure 302b.

The metallization structure may include a gate contact structure 344 (also referred to as gate contact). The gate contact structure 344 may be embedded in (e.g., may be laterally surrounded by) an insulator layer 342. The insulator layer 342 may include a dielectric material, e.g., silicon oxide ($SiO_2$), silicon nitride ($SiN_x$), etc., having, for example, a thickness in the range from about 10 nm to about 100 nm, e.g., a thickness of 40 nm. In some aspects, the insulator layer 342 may include a plurality of insulator layers, e.g. each including a same material or different materials. The gate contact structure 344 may include at least one metal layer, e.g., including tungsten (W), cobalt (Co), etc. The gate contact structure 344 may be in direct physical contact with the gate electrode 308 of the field-effect transistor structure 302a. The gate contact structure 344 may be in direct physical contact with the first electrode 322 of the capacitive memory structure 302b. According to various aspects, the electrical connection between the first electrode 322 of the capacitive memory structure 302b and the gate electrode 308 of the field-effect transistor structure 302a may be formed by the gate contact structure 344.

A further metallization structure (shown, for example, in FIG. 3D and FIG. 3E) may be formed over the capacitive memory structure 302b. The further metallization structure may include a memory contact structure (also referred to as memory contact). The memory contact structure may be embedded in (e.g., may be laterally surrounded by) a further (e.g., second) insulator layer.

Figure 3D:
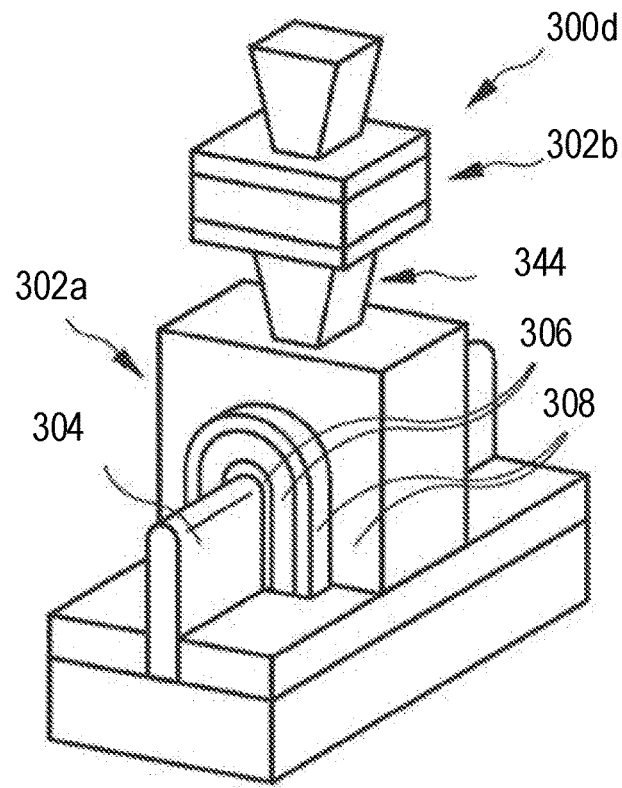
Figure 3E:
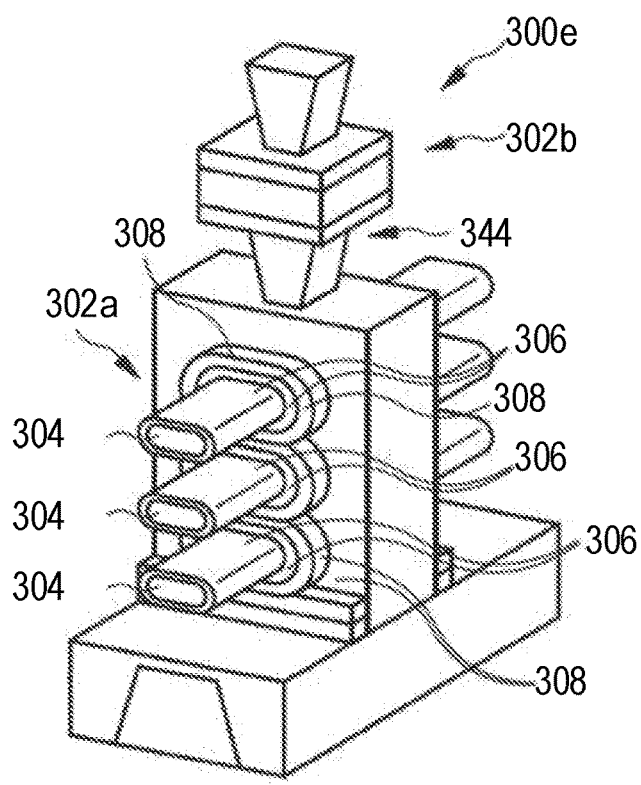

FIG. 3D and FIG. 3E illustrate possible non-planar structures for a memory cell 300d, 300e, e.g. for a field-effect transistor structure 302a (e.g., for a memory transistor described above).

In the integration scheme shown in FIG. 3D, at least the field-effect transistor structure 302a of the memory cell 300d may be configured as a fin field-effect transistor (FinFET). The semiconductor portion in which the channel region 304 is provided may have the shape of a vertical fin, wherein the gate isolation 306 and the gate electrode 308 may at least partially surround the fin.

In the integration scheme shown in FIG. 3E, at least the field-effect transistor structure 302a of the memory cell 300e may be configured as a nanosheet or nanowire field-effect transistor. The one or more semiconductor portions, in which a channel region 304 is provided, may each have the shape of a nanosheet or nanowire. The gate isolation 306 and the gate electrode 308 may at least partially surround the respective nanosheets or nanowires.

For ferroelectric $HfO_2$, its ferroelectric properties may likely disappear when the layer thickness is reduced to below 2 nm or at least when the reduction in film thickness leads to an unacceptable increase of the crystallization temperature such that the ferroelectric phase in $HfO_2$ cannot be stabilized anymore. Therefore, according to various aspects, a layer thickness for a ferroelectric $HfO_2$ layer used in a capacitive memory structure may be selected greater than or equal to 2 nm. For the most advanced transistor platforms, e.g., illustrated exemplarily in FIG. 3D and FIG. 3E, it may be beneficial to arrange the ferroelectric $HfO_2$ layer above the field-effect transistor structure, so that the ferroelectric $HfO_2$ layer can be implemented with the desired layer thickness in these process platforms.

Various aspects of the present disclosure may be related to adapting one or more electrodes of a memory capacitor to provide improved electrical properties and/or improved memory properties of the memory capacitor. In some aspects, an electrode of the memory capacitor may be configured to influence the properties of a memory structure formed thereon, e.g. to influence the growth of a remanent-polarizable layer formed on the electrode. The properties of the electrode may be tuned to obtain desired structural properties of the memory structure (for example, a desired average grain size of a remanent-polarizable material of the memory structure). In some aspects, an electrode of the memory capacitor may be configured to reduce or prevent a migration of oxygen away from the memory structure, which would otherwise lead to a degradation or to a loss of the memory properties. In some aspects, an electrode of the memory capacitor may be configured to reduce or prevent a leakage current from the memory capacitor, thus improving the data retention capabilities of the memory capacitor.

Figure 4A:
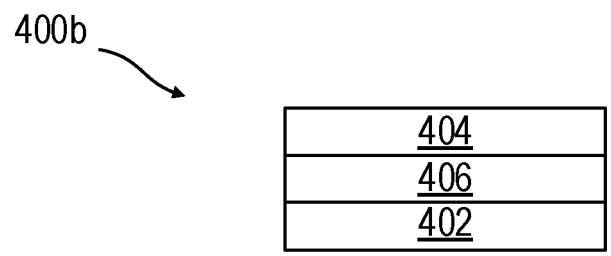
FIG. 4A shows schematically a memory capacitor, according to various aspects.

FIG. 4A illustrates a memory capacitor 400b in a schematic view according to various aspects. In various aspects, the memory capacitor 400b may be configured to as the capacitive memory structure 200b, 302b described in relation to FIG. 2 to FIG. 3E, but may include at least one adapted electrode, as described in further detail below. The memory capacitor 400b may include a first electrode 402 (a bottom electrode), a second electrode 404 (a top electrode), and a memory structure 406 disposed between the first electrode 402 and the second electrode 404 (as described, for example, for the first electrode 322, the second electrode 326, and the memory structure 324). The first electrode 402, the second electrode 404, and the memory structure 406 may form the memory capacitor 400b. Illustratively, the first electrode 402, the second electrode 404, and the memory structure 406 may be disposed with respect to one another in such a way that data (e.g., a logic "0" or a logic "1") may be stored in the memory capacitor 400b, that data may be written by acting on a state of the memory structure 406 via the first electrode 402 and the second electrode 404, and that data may be read out via the first electrode 402 and the second electrode 404 in accordance with the state of the memory structure 406. In some aspects, the memory structure 406 may be in direct physical contact with the first electrode 402 and with the second electrode 404. Illustratively, a first (shared) interface region may be present between the memory structure 406 and the first electrode 402, and a second (shared) interface region may be present between the memory structure 406 and the second electrode 404.

In some aspects, the memory structure may include one or more layers, and at least one layer may include an oxygen containing material (e.g., an oxide). In some aspects, the memory structure 406 may include one or more remanent polarizable layers. The memory structure 406 may allow storage of data based on polarizing (remanently) one or more layers including one or more suitable materials or a suitable combination of materials. In other aspects, the memory structure 406 may include one or more charge storage layers. The memory structure 406 may allow storage of data based on charging (e.g., permanently) one or more charge storage layers including one or more suitable materials or a suitable combination of materials. In still other aspects, the memory structure 406 may include one or more charge storage layers and one or more polarizable layers, e.g., one or more spontaneously polarizable layers (e.g., one or more anti-ferroelectric layers). The memory structure 406 may allow storage of data based on charging (e.g., permanently) one or more charge storage layers assisted by the one or more polarizable layers. In some aspects, the memory structure 406 may have a thickness in the range from about 2 nm to about 50 nm, for example from about 5 nm to about 30 nm, for example from about 10 nm to about 20 nm.

At least one of the first electrode 402 or the second electrode 404 may be adapted to provide improved electrical properties and/or improved memory properties, as described in further detail below, for example in relation to FIG. 5A to FIG. 5D.

Figure 4B:
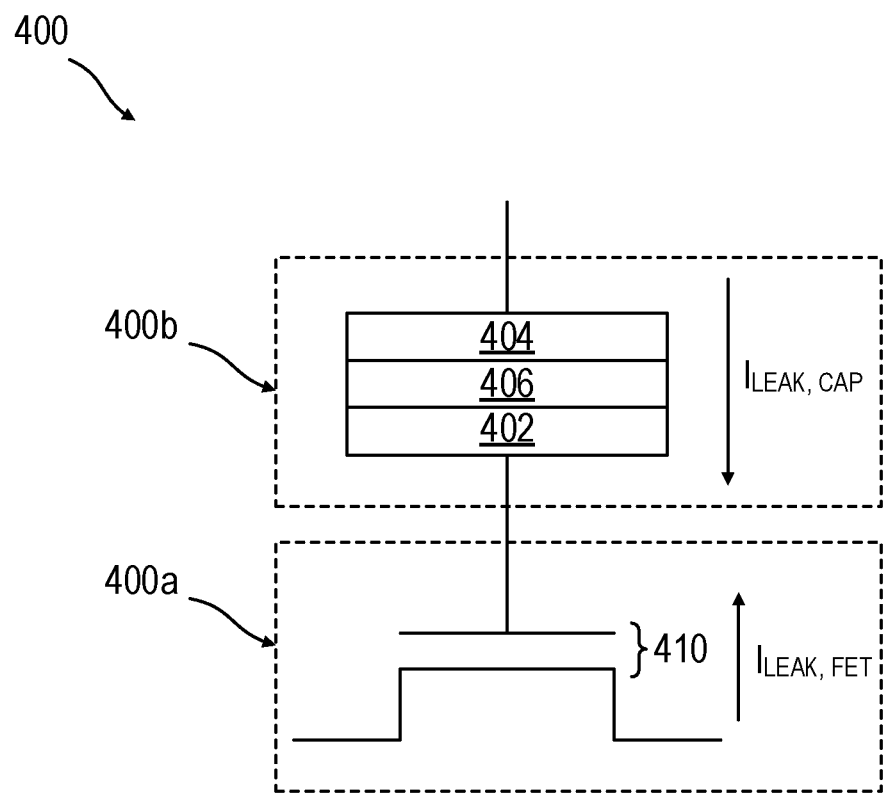
FIG. 4B shows schematically a memory cell, according to various aspects.

FIG. 4B shows a memory cell 400 in a schematic view according to various aspects. The memory cell 400 may be configured as the memory cell 200, 300a, 300b, 300c, 300d, 300e described in relation to FIG. 2, and in relation to FIG. 3A to FIG. 3E.

In various aspects, the memory cell 400 may include a field-effect transistor structure 400a and the memory capacitor 400b coupled with one another. The field-effect transistor structure 400a may be configured as the field-effect transistor structure 100, 200a, 302a described in relation to FIG. 1 to FIG. 3E. The field-effect transistor structure 400a and the memory capacitor 400b may be coupled to one another to form a capacitive voltage divider (see, for example, FIG. 2). The field-effect transistor structure 400a may include a gate structure 410 (including a gate isolation and a gate electrode, as described in relation to the gate isolation 306 and the gate electrode 308 in FIG. 3A to FIG. 3E) coupled to the memory capacitor 400b.

A gate leakage current, $I_{LEAK,\ FET}$, may be present (usually inherently) in a field-effect transistor structure (e.g., in the field-effect transistor structure 400a) resulting in a charge transfer between the gate electrode and a channel region of the field-effect transistor structure, e.g., due to the dimensions of the gate isolation, which may cause a tunnel current and/or a leakage current through grain boundaries or other imperfections in the crystallographic structure of the one or more materials forming the gate isolation. A leakage current, $I_{LEAK,\ CAP}$, may be present in a memory capacitor (e.g., in the memory capacitor 400b) for example due to the amount of charge stored in the memory capacitor decreasing over time, which may be detrimental to data retention. Various aspects may be based on adapting the memory capacitor stack, e.g. at least one of the electrodes, to reduce or prevent the leakage current in the memory capacitor.

According to various aspects, the properties and/or the structure of an electrode, an electrode layer, and/or a functional layer as described herein may be evaluated with techniques known in the art. As an example, transmission electron microscopy (TEM) may be used to determine the structure of a layer (e.g., of an electrode), for example to determine the presence of one or more sub-layers (e.g., the presence of one or more electrode layers and/or the presence of one or more functional layers in the electrode). TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material, e.g. the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g. for analyzing the spatial distribution (e.g., the gradient) of an element across the solid. As a further example, neutron diffraction (also referred to as elastic neutron scattering) may be used to determine the atomic structure of a material.

FIG. 5A to FIG. 5D each illustrates schematically a possible realization of a respective electrode 500a, 500b, 500c, 500d. These electrodes 500a, 500b, 500c, 500d may be an electrode of a memory capacitor (e.g., these electrodes 500a, 500b, 500c, 500d may be one of the first electrode 322, 402 and/or the second electrode 326, 404 of the memory capacitor 302b, 400b). In some aspects, an electrode 500a, 500b, 500c, 500d may include one or more electrode layers 502 and one or more functional layers 504, as described in further detail below. In the following reference may be made to various electrode layers 502, e.g. a first electrode layer 502-1, a second electrode layer 502-2, a third electrode layer 502-3, a fourth electrode layer 502-4, etc., which may be commonly referred to as electrode layer(s) 502. In the following reference may be made to various functional layers 504, e.g. a first functional layer 504-1, a second functional layer 504-2, a third functional layer 504-3, etc., which may be commonly referred to as functional layer(s) 504.

In some aspects, an electrode 500a, 500b, 500c, 500d described herein may be a multilayer electrode including a plurality of electrode layers 502, wherein one of the electrode layers 502 may be in direct physical contact with a memory structure (e.g., with the memory structure 324, 406). Illustratively, the electrode layer 502 in direct physical contact with the memory structure may be uppermost electrode layer in case the electrode 500a, 500b, 500c, 500d is a bottom electrode, or may be the lowermost electrode layer in case the electrode 500a, 500b, 500c, 500d is a top electrode of a memory capacitor.

In some aspects, each electrode layer 502 of an electrode 500a, 500b, 500c, 500d may have a same lateral size. Illustratively, the one or more electrode layers 502 of an electrode 500a, 500b, 500c, 500d may form the electrode 500a, 500b, 500c, 500d, that is the one or more electrode layers 502 may together provide the function(s) associated with the electrode 500a, 500b, 500c, 500d.

In some aspects, an electrode layer 502 may be coupled with a gate structure of a field-effect transistor structure (e.g., with the gate structure of the field-effect transistor structure 302a, 400a). In some aspects, an electrode layer 502 may be distinct from a gate electrode of the gate structure, e.g. may not be part of the gate electrode.

In some aspects, an electrode 500a, 500b, 500c, 500d described herein may be configured such that at least one property suitable for influencing the memory structure varies gradually across the plurality of electrode layers 502 until it reaches a desired value in the electrode layer in direct physical contact with the memory structure. The multilayer electrode may influence the memory structure during its formation (e.g., during deposition or growth), such that the memory structure formed on the multilayer electrode possesses one or more desired properties (e.g., a desired average grain size, a desired grain size distribution, as examples).

Various aspects may be based on the realization that the properties (e.g., the microstructural properties) of an electrode, which may result from the formation of the electrode on a substrate or on a buffer layer, may be not well suited for forming a memory structure on the electrode. Various aspects may be based on gradually adapting the properties of an electrode across its body, from the properties suitable for its formation on a substrate (for example, on the insulator layer 342, or on the contact structure 344, as shown in FIG. 3C) to the properties suitable for forming an improved memory structure thereon (e.g., a memory structure capable of switching faster from one state to another state, or with improved data retention capabilities, as examples).

Various aspects may be based on the realization that, although an adapted (e.g., multilayer) electrode as described herein may be more expensive and/or more difficult to fabricate and is thus not employed in a usual memory cell or in a usual memory capacitor, the adaptation of the properties of the electrode may provide a superior performance of a memory cell, as described in further detail below.

In some aspects, an electrode 500a, 500b, 500c, 500d may have a thickness in the range from about 1 nm to about 50 nm, for example from about 1 nm to about 30 nm, for example from about 5 nm to about 20 nm. A thickness of an electrode 500a, 500b, 500c, 500d may be understood as total thickness provided by the respective thicknesses of the one or more electrode layers 502 and the one or more functional layers 504.

An electrode layer 502 may be, in some aspects, an electrically conductive layer. An electrode layer 502 may include an electrically conductive material, such as a metal material or any other conductive material (e.g., a metal alloy, a degenerate semiconductor, a polysilicon layer, etc.). In some aspects, a material of an electrode layer 502 may include at least one of Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), as examples. In some aspects, a material of an electrode layer 502 may have an electrical conductivity greater than $10^6$ S/m at a temperature of 20° C. In some aspects, an electrode layer 502 may include a thickness less than 10 nm, for example less than 5 nm, for example less than 2 nm, for example a thickness in the range from about 0.1 nm to about 1 nm, for example a thickness in the range from about 0.2 nm to about 0.5 nm.

In some aspects, an electrode 500a, 500b, 500c, 500d described herein may include a conductivity gradient across the electrode. Illustratively, the electrode 500a, 500b, 500c, 500d may include an initial electrode layer having an initial electrical conductivity the farthest away from the memory structure, and may include a final electrode layer having a final electrical conductivity, the final electrode layer being at the interface region between the electrode 500a, 500b, 500c, 500d and a memory structure. The final electrical conductivity may be, in some aspects, less than the initial electrical conductivity (e.g., the final electrical conductivity may be an order of magnitude less than the initial electrical conductivity, or may be at least two times less than the initial electrical conductivity). This may provide, for example, that a charge stored in the memory structure may remain confined therein, thus reducing a leakage current in a memory capacitor. The final electrical conductivity may be, in some aspects, greater than the initial electrical conductivity (e.g., the final electrical conductivity may be an order of magnitude greater than the initial electrical conductivity, or may be at least two times greater than the initial electrical conductivity). This may provide, for example, an improved switching of a state of the memory structure. An electrical conductivity of a layer may be understood, in some aspects, as an electrical conductivity of a material of the layer, e.g. an electrical conductivity of a main component of the layer or as an average electrical conductivity provided by the materials that the layer includes.

In some aspects, a material of an electrode layer 502 may have a microstructure, illustratively one or more microstructural properties. As used herein, a microstructure or a microstructural property may include at least one of: granularity, average grain size, grain size distribution, number of grain boundaries, density of grain boundaries, shape of grain boundaries, chemical composition of grain boundaries, regions between two adjacent grains, content of defects, type of defects, and/or chemical composition of defects. A defect may be, in some aspects, an interstitial defect, for example an oxygen interstitial.

In some aspects, an electrode 500a, 500b, 500c, 500d described herein may include a gradient of at least one microstructural property across the electrode. Illustratively, the electrode 500a, 500b, 500c, 500d may include an initial electrode layer including a material with an initial microstructural property the farthest away from the memory structure, and may include a final electrode layer including a material with a final microstructural property at the interface region between the final electrode layer and the memory structure. The final electrode layer may have a microstructure that provides a desired microstructure in the memory structure formed thereon (for example, a microstructure with a reduced average grain size, or with increased average grain size).

In some aspects, a material of an electrode layer 502 may have a crystal structure, e.g. cubic crystal structure, a monoclinic crystal structure, a tetragonal crystal structure, a hexagonal crystal structure, as examples. A crystal structure of a material of an electrode layer may have one or more crystal structure properties, the one or more crystal structure properties may include: a lattice constant, a symmetry (e.g., a point symmetry), a bond length, an atomic packing factor, a number of atoms per unit cell, and the like.

In some aspects, an electrode 500a, 500b, 500c, 500d described herein may include a gradient of a crystal structure across the electrode. Illustratively, the electrode 500a, 500b, 500c, 500d may include an initial electrode layer including a material with an initial crystal structure (with initial crystal structure properties) the farthest away from the memory structure, and may include a final electrode layer including a material with a final crystal structure (with final crystal structure properties) at the interface region between the final electrode layer and the memory structure. The final electrode layer 502 may have a crystal structure that provides a desired crystal structure in the memory structure formed thereon (for example, a crystal structure with high symmetry).

In some aspects, a same material may have different crystal structures (e.g., one or more different crystal properties). As an example, a same material with different proportions of the participating elements may have different crystal structures, for example a crystal structure of a same class (e.g., cubic, tetragonal, etc.) but with one or more different crystal structure properties (e.g., a different lattice constant, different bond length, and the like). In some aspects, different materials may have a same crystal structure, for example, a crystal structure of a same class (e.g., cubic, tetragonal, etc.) and/or one or more same crystal structure properties (e.g., a same lattice constant, a same bond length, and the like).

In some aspects, the final electrode layer 502 of the electrode 500a, 500b, 500c, 500d may be configured to provide epitaxial growth of a memory structure (e.g., of a remanent-polarizable layer) formed thereon. Illustratively, an electrode layer 502 of the electrode 500a, 500b, 500c, 500d in direct contact with a memory structure (e.g., an electrode layer 502 on which a memory structure is formed or should be formed) may be understood as an optimum seed layer to provide desired properties (e.g., a desired microstructure, a desired crystal structure, as examples) of the memory structure.

A functional layer 504 may be a layer configured to provide a certain function in the electrode 500a, 50b, 500c, 500d. In some aspects, a functional layer 504 may be configured to influence the properties of another layer (e.g., of an electrode layer 502 or of a layer of a memory structure) formed thereon. In some aspects, a functional layer 504 may be configured to provide an oxygen diffusion barrier to reduce or prevent diffusion of oxygen through the electrode 502 (illustratively, through the layers forming the electrode 502). In some aspects, a functional layer may define a transition region from a first portion of the electrode 500a, 500b, 500c, 500d having a first property (or first properties) and a second portion of the electrode 500a, 500b, 500c, 500d having a second property (or second properties).

The term "functional layer" as used herein may describe, in some aspects, an interface region (also referred to herein as interface portion) between two layers, e.g. between an electrode layer and another electrode layer or between an electrode layer and a layer of a memory structure. The interface region may include an uppermost portion of a lower layer and a lowermost portion of an upper layer, as an example. An interface region may be understood as a transition region in which the properties of a layer change or start to change. Illustratively, a layer may have certain properties (e.g., a certain microstructure, a certain electrical conductivity, and the like), and the interface region may have different properties with respect to the other portion(s) of the layer, e.g. with respect to an inner portion (illustratively, a bulk) of the layer. An interface region may be, in some aspects, a perfect interface between the two layers, e.g. without any intermixing of the elements (the atoms) of the two layers. In other aspects, an interface region may include an intermixing of the elements of the two layers, and may illustratively extend into the two layers (e.g., for up to three monolayers in direction of the first layer and for up to three monolayers in direction of the second layer, as a numerical example). An interface region may be understood, in some aspects, as a distinct layer, for example in case the interface region extends for more than three monolayers into the first layer and for more than three monolayers into the second layer. The term "functional layer" as used herein may describe, in some aspects, an additional layer interposed between two layers, that is a distinct layer (e.g., including a different material) with respect to the two layers. The functional layer interposed between the two layers may be, in some aspects, a monolayer including a different material with respect to the two layers, for example, the functional layer may be a monolayer of an electrically insulating material interposed between two electrode layers including an electrically conducting material.

In some aspects, a functional layer 504 may have a thickness in the range from about 0.1 nm to about 5 nm, for example a thickness of less than 1 nm, or less than 5 Å, or less than 2 Å. A functional layer 504 as described herein may thus distinguish from electrically insulating layers (e.g., liners) commonly used in the art for the fabrication of electrodes, memory cells, or memory capacitors, since such electrically insulating layers have a much greater thickness for providing electrical isolation. A thin functional layer as described herein would thus not be implemented in those structures (for example as part of a metallization). The functional layer describe herein serve rather a different purpose, that is influencing the properties of a layer formed on the functional layer, and/or providing an oxygen barrier for reducing or preventing oxygen diffusion, as described in further detail below.

In some aspects, the thickness of a functional layer 504 may be such that an overall high voltage conductivity (or high current conductivity) of an electrode 500a, 500b, 500c, 500d is not substantially altered. Illustratively, the thickness of a functional layer 504 may be such that the electrode 500a, 500b, 500c, 500d may still be used to allow a write operation or a readout operation of a memory capacitor without increasing a write voltage or a readout voltage. The thickness of a functional layer 504 may be such that an electrical conductivity of an electrode 500a, 500b, 500c, 500d is substantially not altered in case a voltage greater of 0.5 V or greater than 1 V is provided at the electrode 500a, 500b, 500c, 500d.

In some aspects, a functional layer 504 may include an electrically insulating material for example a dielectric material such as an electrically insulating oxide or an electrically insulating nitride material (e.g., aluminum oxide, aluminum nitride, silicon oxide, silicon nitride, silicon oxynitride, $Al_2O_3$, AlN, $AlO_xN_y$, or $SiO_2$, SiN, $SiO_xN_y$, as examples). In some aspects, a functional layer 504 may include an electrically conductive material, for example a metal material, a metal alloy, an electrically conductive oxide material, an electrically conductive nitride material, e.g., tantalum nitride, indium oxide, copper silicide, tungsten nitride, titanium nitride, ruthenium oxide, rhenium oxide, iridium oxide, as examples. In some aspects, a material of a functional layer 504 may include at least one of Germanium (Ge), Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), Hafnium (Hf), Lanthanum (La), Nickel (Ni), Tantalum (Ta), Hafnium (Hf), Niobium (Nb), Zirconium (Zr), Indium (In), Vanadium (V), Silicon (S), and/or the respective oxide and/or the respective nitride as examples.

In some aspects, a material of a functional layer 504 may be selected in accordance with a material of an adjacent electrode layer 502, e.g. in accordance with the material of one of the adjacent electrode layers 502. The material of a functional layer 504 may be, in some aspects, a metal oxide including a metal material of an adjacent electrode layer 502. As an example, the material of an electrode layer 502 may include ruthenium, and the material of an adjacent functional layer 504 may include ruthenium oxide.

In some aspects, a functional layer 504 may be configured to reduce or prevent oxygen diffusion in the electrode 500a, 500b, 500c, 500d, e.g. in an adjacent electrode layer 502. A functional layer 504 may be configured as an oxygen diffusion barrier for an adjacent electrode layer 502. Illustratively, a rate of diffusion of oxygen (also referred to herein as oxygen diffusion rate) in a functional layer 504 may be less than a rate of diffusion of oxygen in an electrode layer 502. In some aspects, a material of an electrode layer 502 may strongly attract (and absorb) oxygen, which may reduce the electrical conductivity of the electrode layer 502 (for example in case the material of the electrode layer 502 includes Ti). The electrode layer 502 may attract oxygen, for example, from a memory structure, e.g. from an oxygen containing layer of the memory structure, so that the memory properties (e.g., the remanent-polarizable properties) of the memory structure may degrade. A functional layer 504 disposed between the electrode layer 502 and the memory structure may be configured to reduce or prevent the diffusion of oxygen from the memory structure to the electrode layer 502. An oxygen diffusion rate of a layer may be understood, in some aspects, as an oxygen diffusion rate of a material of the layer, e.g. an oxygen diffusion rate of a main component of the layer or as an average oxygen diffusion rate provided by the materials that the layer includes.

In some aspects, a functional layer 504 may be configured to absorb oxygen, e.g. may be configured as an oxygen trapping layer. A material of the functional layer 504 (e.g., chromium) may have affinity for oxygen, such that oxygen is absorbed in the functional layer 504 forming an oxide. After formation of the oxide, further oxidation of the material of the functional layer 504 may be prevented, as well as of the electrode layer(s) 502 disposed underneath the functional layer 504.

In some aspects, a functional layer 504 may be patterned. Illustratively, in some aspects, a functional layer 504 may be a non-continuous layer including one or more islands, or including one or more through holes in an otherwise continuous layer. This may provide, in some aspects, an increased electrical conductivity of the electrode 500a, 500b, 500c, 500d with a tradeoff with the barrier properties and/or the growth influencing properties of the patterned functional layer 504.

Figure 5A:
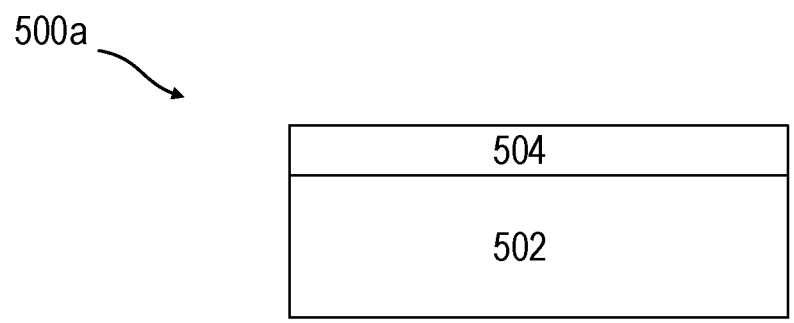
FIG. 5A to FIG. 5D each shows schematically an electrode, according to various aspects.

In some aspects, as shown in FIG. 5A, the electrode 500a may include an electrode layer 502, and a functional layer 504 in direct contact with the electrode layer 502. The functional layer 504 may be configured to reduce or prevent oxygen diffusion into the electrode layer 502. Illustratively, the functional layer 504 may be an oxygen barrier layer reducing or preventing oxygen from diffusing into the electrode layer 502. In some aspects, the functional layer 504 may be in direct contact with a memory structure (e.g., with the memory structure 324, 406). The functional layer 504 may be in direct contact with a layer of the memory structure that includes an oxygen containing material (for example, with a remanent-polarizable layer including hafnium oxide and/or zirconium oxide). The functional layer 504 may be configured to prevent oxygen diffusion from the memory structure (from the oxygen containing layer) into the electrode layer 502. In FIG. 5A, the functional layer 504 is illustrated as an uppermost layer of the electrode 500 (e.g., in case the electrode 500a is a bottom electrode of a memory capacitor); it is however understood that the functional layer 504 may additionally or alternatively be a lowermost layer of the electrode 500, e.g. in case the electrode 500a is a top layer of a memory capacitor.

In the configuration of the electrode 500a shown in FIG. 5A, the presence of the functional layer 504 between the electrode layer 502 and a memory structure may reduce the capacitance of a memory capacitor. Illustratively, the presence of the functional layer 504 may increase the distance between the electrodes of the memory capacitor (e.g., the electrode 500a and another electrode). In some aspects, the material of the functional layer 504 may be electrically conductive in addition to providing the oxygen diffusion barrier or oxygen absorbing functionalities described above. As an example, the material of the functional layer 504 may be an electrically conductive oxide, such as ruthenium oxide, rhenium oxide, or iridium oxide, as examples. The electrically conductive functional layer 504 may reduce or prevent the reduction in capacitance of the memory capacitor.

Figure 5B:
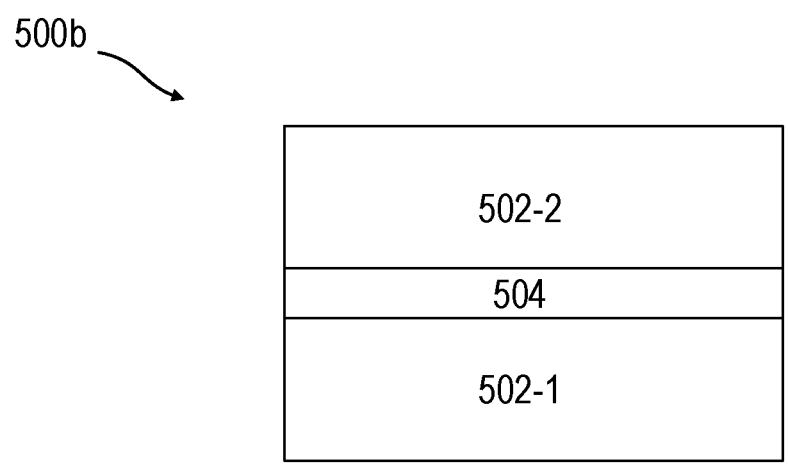

In some aspects, as shown in FIG. 5B, the electrode 500b may include a first electrode layer 502-1, a functional layer 504 in direct contact with the first electrode layer 502-1, and a second electrode layer 502-2 in direct contact with the functional layer 504. In the following description of the electrode 500b it is assumed that the second electrode layer 502-2 may be (or is intended to be) closer to a memory structure with respect to the first electrode layer 502-1, e.g. it is assumed that the second electrode layer 502-2 may be in direct contact with the memory structure. It is however understood that the same functionalities may be provided in the case that the first electrode layer 502-1 is (or is intended to be) closer to a memory structure with respect to the second electrode layer 502-2, e.g. in case that the first electrode layer 502-1 is in direct contact with the memory structure.

In some aspects, the functional layer 504 may be configured to reduce or prevent an oxygen diffusion between the electrode layers, e.g. from the second electrode layer 502-2 into the first electrode layer 502-1 (or vice versa). In some aspects, the second electrode layer 502-2 may be in direct contact with a memory structure, e.g. with an oxygen containing layer thereof, and the functional layer 504 may be configured to prevent the oxygen that may have diffused from the memory structure into the second electrode layer 502-2 from diffusing further in the electrode 500b (e.g., in the first electrode layer 502-1, or in any further electrode layer 502 underneath). The configuration of the electrode 500b shown in FIG. 5B may provide a reduced oxygen diffusion in the electrode 500b without reducing a capacitance of a memory capacitor.

In some aspects, the first electrode layer 502-1 may have a first oxygen diffusion rate and the second electrode layer 502-2 may have a second oxygen diffusion rate different from the first oxygen diffusion rate. The oxygen diffusion rates of different electrode layers (e.g., the first oxygen diffusion rate of the first electrode layer 502-1 and the second oxygen diffusion rate of the second electrode layer 502-2) may be adapted to provide desired properties of a memory structure formed in contact with an electrode (e.g., with the electrode 500b), for example to provide a desired oxygen diffusion in the electrode to induce desired polarization properties in the memory structure. In some aspects, the second oxygen diffusion rate may be less than the first oxygen diffusion rate. As a numerical example, the second oxygen diffusion rate may be at least 10% less or at least 20% less than the first oxygen diffusion rate. Illustratively, in case the second electrode layer 502-2 is closer to an oxygen-rich memory structure or to an oxygen-rich layer of a memory structure with respect to the first electrode layer 502-1, the second electrode layer 502-2 may provide a barrier for oxygen diffusion into the first electrode layer 502-1, for example in combination with the functional layer 504. In some aspects, the second oxygen diffusion rate may be greater than the first oxygen diffusion rate. As a numerical example, the second oxygen diffusion rate may be at least 10% greater or at least 20% greater than the first oxygen diffusion rate. The second electrode layer 502-2 may allow oxygen diffusion that is then stopped at the interface with the first electrode layer 502-1.

In some aspects, the functional layer 504 may have an oxygen diffusion rate less than the first oxygen diffusion rate and less than the second oxygen diffusion rate. The functional layer 504 may provide a (further) oxygen diffusion barrier in the electrode 500b.

In some aspects, the functional layer 504 may have an oxygen diffusion rate greater than the first oxygen diffusion rate and less than the second oxygen diffusion rate (or less than the first oxygen diffusion rate and greater than the second oxygen diffusion rate). Illustratively, in some aspects, the functional layer 504 may have an intermediate oxygen diffusion rate between the oxygen diffusion rates of adjacent electrode layers 502 (e.g., of the first electrode layer 502-1 and of the second electrode layer 502-2). The functional layer 504 may be an interface region (illustratively, a transition region) between the first electrode layer 502-1 and the second electrode layer 502-2 to provide a desired gradient of oxygen diffusion through the electrode 500b.

In some aspects, the first electrode layer 502-1 may have a first electrical conductivity and the second electrode layer 502-2 may have a second electrical conductivity different from the first electrical conductivity. The electrical conductivities of different electrode layers (e.g., the first electrical conductivity of the first electrode layer 502-1 and the second electrical conductivity of the second electrode layer 502-2) may be adapted to provide desired properties of a memory structure and/or of a memory capacitor, for example a desired range of a writing voltage and/or of a readout voltage, or a desired reduction of leakage current in the memory capacitor, as examples. In some aspects, the second electrical conductivity may be less than the first electrical conductivity. As a numerical example, the second electrical conductivity may be half of the first electrical conductivity, or one third of the first electrical conductivity, or one fifth of the first electrical conductivity, or one tenth of the first electrical conductivity. The reduced electrical conductivity closer to a memory structure may provide a reduced leakage current in a memory capacitor, as described above. In some aspects, the second electrical conductivity may be greater than the first electrical conductivity. As a numerical example, the second electrical conductivity may be two times the first electrical conductivity, or three times the first electrical conductivity, or five times of the first electrical conductivity, or ten times the first electrical conductivity. The increased electrical conductivity closer to a memory structure may provide a faster control over a state of the memory structure, e.g. a faster switching from a first memory state to a second memory state.

In some aspects, the functional layer 504 may have an electrical conductivity less than the first electrical conductivity and less than the second electrical conductivity. Illustratively, in some aspects, an electrode 500a, 500b, 500c, 500d may include electrode layers 502 having decreasing electrical conductivity with functional layers 504 therebetween, for example to provide oxygen diffusion barriers. In some aspects, a difference between the electrical conductivity of the functional layer 504 and the electrical conductivity of one of the adjacent electrode layers 502-1, 502-2 may have an absolute value of at least $10^{10}$ S/m at a temperature of 20° C.

In some aspects, the functional layer 504 may have an electrical conductivity less than the first electrical conductivity and greater than the second electrical conductivity (or greater than the first electrical conductivity and less than the second electrical conductivity). Illustratively, in some aspects, a functional layer 504 may have an intermediate electrical conductivity between the conductivities of adjacent electrode layers (e.g., of the first electrode layer 502-1 and of the second electrode layer 502-2). The functional layer 504 may be an interface region (illustratively, a transition region) between the first electrode layer 502-1 and the second electrode layer 502-2 to provide the desired electrical conductivity gradient.

In some aspects, the first electrode layer 502-1 may include a first material, and the second electrode layer 502-2 may include a second material different from the first material. In some aspects, the first material of the first electrode layer 502-1 may have a first main component, and the second material of the second electrode layer 502-2 may have a second main component different from the first main component. Illustratively, in some aspects, the electrode 500a, 500b, 500c, 500d may include a material gradient, going from a (first, or initial) material suitable for forming the electrode on a substrate to a (second, or final) material suitable for forming a memory structure on the electrode 500a, 500b, 500c, 500d.

In some aspects, the first material of the first electrode layer 502-1 may include a first chemical composition and the second material of the second electrode layer 502-2 may include a second chemical composition different from the first chemical composition. The first chemical composition may be different from the second chemical composition in at least one of doping and/or content of the participating elements. In some aspects, the material of the various electrode layers may not vary in terms of main component, or of participating elements, but may slightly vary in terms of relative amount of the participating elements, for example to gradually adapt the properties (e.g., structural, electrical, thermal, etc.) of the electrode layers 502 to reach desired properties at the interface with a memory structure.

In some aspects, the first material of the first electrode layer 502-1 may include a first weight percentage of oxygen, and a second material of the second electrode layer 502-2 may include a second weight percentage of oxygen different from the first weight percentage of oxygen. Varying the content of oxygen through the electrode 500b may provide, for example, adapting the crystal structure of the electrode layers 502 through the electrode, to provide a desired crystal structure at the interface with the memory structure. In some aspects, the first weight percentage of oxygen may be less than the second weight percentage of oxygen (e.g., half, one third, one fifth, one tenth, as examples). In some aspects, the first weight percentage of oxygen may be greater than the second weight percentage of oxygen (e.g., two times greater, three times greater, five times greater, ten times greater, as examples). The adaptation of the oxygen content may be in accordance with the desired properties of the memory structure formed or to be formed on the electrode 500a, 500b, 500c, 500d. In some aspects, the second material of the second electrode layer 502-2 having a greater weight percentage of oxygen with respect to the first material of the first electrode layer 502-1 may provide oxygen diffusion barrier functionalities to reduce or prevent a diffusion of oxygen into the first electrode layer 502-1. In some aspects, the second material of the second electrode layer 502-2 having less weight percentage of oxygen with respect to the first material of the first electrode layer 502-1 may provide a crystal structure of the second material of the second electrode layer 502-2 having a reduced lattice constant, to provide a desired lattice constant in the memory structure formed thereon, as an example. It may be understood that the same may apply to a volume percentage of oxygen, e.g. the first material of the first electrode layer 502-1 may include a first volume percentage of oxygen, and a second material of the second electrode layer 502-2 may include a second volume percentage of oxygen different from (e.g., less than or greater than) the first volume percentage of oxygen.

In some aspects, the functional layer 504 may include a material having a weight percentage of oxygen less than the first weight percentage of oxygen and less than the second weight percentage of oxygen. Illustratively, in some aspects, an electrode 500a, 500b, 500c, 500d may include electrode layers 502 having decreasing (or increasing) weight percentage of oxygen with functional layers 504 therebetween, for example to provide (further) oxygen diffusion barriers. The same may apply to a volume percentage of oxygen of the material of the functional layer 504.

In some aspects, the functional layer 504 may include a material having a weight percentage of oxygen less than the first weight percentage of oxygen and greater than the second weight percentage of oxygen (or greater than the first weight percentage of oxygen and less than the second weight percentage of oxygen). Illustratively, in some aspects, the material of the functional layer 504 may have an intermediate weight percentage of oxygen between the weight percentages of oxygen of the materials of the adjacent electrode layers 502 (e.g., of the first electrode layer 502-1 and of the second electrode layer 502-2). The functional layer 504 may be an interface region between the first electrode layer 502-1 and the second electrode layer 502-2 to provide the desired gradient of weight percentage of oxygen. The same may apply to a volume percentage of oxygen of the material of the functional layer 504.

In some aspects, the first material of the first electrode layer 502-1 may include a first crystal structure, and the second material of the second electrode layer 502-2 may include a second crystal structure different from the first crystal structure. Illustratively, the first material of the first electrode layer 502-1 may include one or more first crystal structure properties (e.g., a first lattice constant, a first point symmetry, a first bond length, a first atomic packing factor, a first number of atoms per unit cell), and the second material of the second electrode layer 502-2 may include one or more second crystal structure properties (e.g., a second lattice constant, a second point symmetry, a second bond length, a second atomic packing factor, a second number of atoms per unit cell), wherein at least one of the first crystal structure properties may be different from the respective second crystal structure property. The crystal structure of the electrode layers 502 may be gradually adapted to provide a desired crystal structure at the interface with the memory structure (e.g., to induce desired crystal structure properties in the memory structure). Only as an example, the first material of the first electrode layer 502-1 may include a greater bond length and/or a greater lattice constant with respect to the second material of the second electrode layer 502-2.

In some aspects, a material of the functional layer 504 may include intermediate crystal structure properties with respect to the crystal structure properties of the materials of the adjacent electrode layers (e.g., with respect to the first crystal structure properties and the second crystal structure properties). The functional layer 504 may be an interface region between the first electrode layer 502-1 and the second electrode layer 502-2 to provide the desired gradient of crystal structure properties. Only as an example, the material of the functional layer 504 may include a bond length greater than the second bond length and less than the first bond length and/or a lattice constant greater than the second lattice constant and less than the first lattice constant.

In some aspects, a material of a memory structure (e.g., a material of a layer of the memory structure) may include a crystal structure substantially equal to the crystal structure of the electrode layer 502 in direct contact therewith. As an example, the material of the memory structure may include a crystal structure substantially equal to the second crystal structure, e.g. the material of the memory structure may include crystal structure properties substantially equal to the second crystal structure properties.

In some aspects, the first material of the first electrode layer 502-1 may include a first microstructure, and the second material of the second electrode layer 502-2 may include a second microstructure different from the first microstructure. Illustratively, the first material of the first electrode layer 502-1 may include one or more first microstructural properties (e.g., a first granularity, a first average grain size, a first grain size distribution, a first number of grain boundaries, a first density of grain boundaries, a first shape of grain boundaries, a first chemical composition of grain boundaries, first regions between two adjacent grains, a first content of defects, a first type of defects, and/or a first chemical composition of defects), and the second material of the second electrode layer 502-2 may include one or more second microstructural properties (e.g., a second granularity, a second average grain size, a second grain size distribution, a second number of grain boundaries, a second density of grain boundaries, a second shape of grain boundaries, a second chemical composition of grain boundaries, second regions between two adjacent grains, a second content of defects, a second type of defects, and/or a second chemical composition of defects), wherein at least one of the first microstructural properties may be different from the respective second microstructural property. The microstructure of the electrode layers 502 may be gradually adapted to provide a desired microstructure at the interface with the memory structure.

In some aspects, the first material of the first electrode layer 502-1 may include a plurality of grains having a first average grain size and/or a first grain size distribution, and the second material of the second electrode layer 502-2 may include a plurality of grains having a second average grain size and/or a second grain size distribution. The first average grain size may be different from the second average grain size and/or the first grain size distribution may be different from the second grain size distribution. Varying the average grain size and/or the grain size distribution through the electrode 500b may provide, for example, adapting the crystal structure of the electrode layers 502 through the electrode, to provide a desired crystal structure at the interface with the memory structure.

In some aspects, the first average grain size may be greater than the second average grain size, for example at least two times greater or at least three times greater. Providing an electrode layer 502 with relatively small grain size at the interface with the memory structure may provide influencing the material of the memory structure (during its formation) such that it includes relatively small grains (a plurality of grains having a relatively small average grain size), see also FIG. 6B. In some aspects, the first average grain size may be less than the second average grain size, for example half or one third of the second average grain size. Providing an electrode layer 502 with relatively large grain size at the interface with the memory structure may provide influencing the material of the memory structure (during its formation) such that it includes relatively large grains (a plurality of grains having a relatively large average grain size). The average grain size of the grains of the material of the memory structure may be influenced depending on the desired properties (e.g., electrical and/or polarization properties) of the memory structure.

In some aspects, the first grain size distribution may be broader than the second grain size distribution, for example at least two times broader or at least three times broader. Providing an electrode layer 502 with relatively narrow grain size distribution at the interface with the memory structure may provide influencing the material of the memory structure (during its formation) such that it includes more uniform grains, e.g. grains with more uniform size with respect to one another. In some aspects, the first grain size distribution may be narrower than the second grain size distribution. The grain size distribution of the grains of the material of the memory structure may be influenced depending on the desired properties (e.g., electrical and/or polarization properties) of the memory structure.

In some aspects, a material of the functional layer 504 may include intermediate microstructural properties with respect to the microstructural properties of the materials of the adjacent electrode layers (e.g., with respect to the first microstructural properties and the second microstructural properties). The functional layer 504 may be an interface region between the first electrode layer 502-1 and the second electrode layer 502-2 to provide the desired gradient of microstructural properties. As an example, the material of the functional layer 504 may include an average grain size greater than the second average grain size and less than the first average grain size and/or a grain size distribution broader than the second grain size distribution and narrower than the first grain size distribution.

In some aspects, a material of a memory structure (e.g., a material of a layer of the memory structure) may include a microstructure substantially equal to the microstructure of the electrode layer in direct contact therewith. As an example, the material of the memory structure may include a microstructure substantially equal to the second microstructure, e.g. the material of the memory structure may include microstructural properties substantially equal to the second microstructural properties. The material of the memory structure may include a plurality of grains having an average grain size substantially equal to the second average grain size and/or a grain size distribution substantially equal to the second grain size distribution. The material of the memory structure may include a plurality of grains having an average grain size less than the first average grain size and/or a grain size distribution narrower than the first grain size distribution. Providing controlled average grain size and/or controlled grain size distribution of the material of the memory structure may provide tailoring the properties of the memory structure, e.g. tailoring its polarization properties, for example to provide a stronger ferroelectric behavior.

In some aspects, the first electrode layer 502-1 may include a first thickness and the second electrode layer 502-2 may include a second thickness different from the first thickness. Varying the thickness of the electrode layers 502 through the electrode 500a, 500b, 500c, 500d may provide, for example, adapting the microstructural properties and/or the crystal structure properties of the electrode layers 502 through the electrode 500a, 500b, 500c, 500d, to provide a desired microstructure and/or crystal structure at the interface with the memory structure. In some aspects, the first thickness may be less than the second thickness (e.g., half, one third, one fifth, one tenth, as examples). In some aspects, the first thickness may be greater than the second thickness (e.g., two times greater, three times greater, five times greater, ten times greater, as examples). The adaptation of the thickness may be in accordance with the desired properties of the memory structure formed or to be formed on the electrode 500a, 500b, 500c, 500d. In some aspects, the second electrode layer 502-2 having a greater thickness with respect to the first electrode layer 502-1 may provide oxygen diffusion barrier functionalities to reduce or prevent a diffusion of oxygen into the first electrode layer 502-1.

It may be understood that the structure of an electrode 500a, 500b, 500c, 500d is not limited to two electrode layers 502 and is not limited to one functional layer 504. The number of electrode layers 502 and the number of functional layers 504 may be adapted (e.g., selected) in accordance with the desired properties to be provided for forming the memory structure, e.g. with the desired gradient of one or more properties to be provided through the electrode 500a, 500b, 500c, 500d.

Figure 5C:
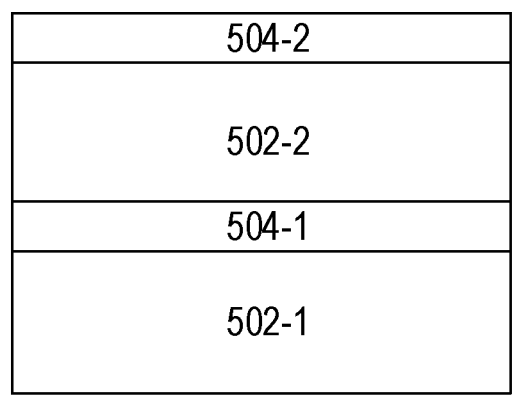

As shown, for example, in FIG. 5C, the electrode 500c may include a plurality of functional layers 504, e.g. a first functional layer 504-1 disposed between a first electrode layer 502-1 and a second electrode layer 502-2 (a first functional layer 504-1 in direct contact with the first electrode layer 502-1 and with the second electrode layer 502-2), and a second functional layer 504-2 in direct contact with the second electrode layer 502-2. The first functional layer 504-1 and the second functional layer 504-2 may be configured as described above in relation to the functional layer 504 in relation to FIG. 5A and FIG. 5B, e.g. to provide oxygen diffusion barrier functionalities and/or to provide a gradual variation of one or more properties through the electrode 500c.

Figure 5D:
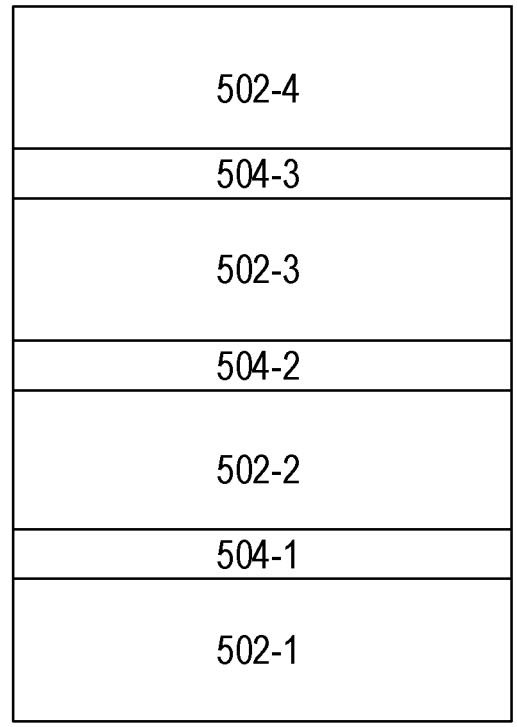

As shown, for example, in FIG. 5D, the electrode 500d may include a plurality of electrode layers 502 and a plurality of functional layers 504. In the exemplary configuration illustrated in FIG. 5D, the electrode 500d may include a first electrode layer 502-1, a second electrode layer 502-2, a third electrode layer 502-3, and a fourth electrode layer 502-4, a first functional layer 504-1 disposed between (and in direct contact with) the first electrode layer 502-1 and the second electrode layer 502-2, a second functional layer 504-2 disposed between (and in direct contact with) the second electrode layer 502-2 and the third electrode layer 502-3, and a third functional layer 504-3 disposed between (and in direct contact with) the third electrode layer 502-3 and the fourth electrode layer 502-4. In the exemplary configuration in FIG. 5D it may be assumed that the fourth electrode layer 502-4 may be (or is intended to be) closer to a memory structure with respect to the other electrode layers 502, e.g. it is assumed that the fourth electrode layer 502-4 may be in direct contact with the memory structure.

In some aspects, each electrode layer 502 may have a varying property with respect to the preceding (and subsequent) electrode layers 502. As an example a third material of the third electrode layer 502-3 may have a third microstructure different from the first microstructure and from the second microstructure. A fourth material of the fourth electrode layer 502-4 may have a fourth microstructure different from the first microstructure, from the second microstructure, and from the third microstructure, etc. As described above, a gradient of one or more properties may be provided across the electrode 500a, 500b, 500c, 500d.

As an example, the third material may include a plurality of grains having a third average grain size and a third grain size distribution. The fourth material may include a plurality of grains having a fourth average grain size and a fourth. A relationship between the average grain sizes may be first average grain size>second average grain size>third average grain size>fourth average grain size, as an example. In some aspects a relationship between the average grain sizes may be first average grain size<second average grain size<third average grain size<fourth average grain size. A relationship between the grain size distributions may be first grain size distribution broader than second grain size distribution, second grain size distribution broader than third grain size distribution, and third grain size distribution broader than fourth grain size distribution, as an example. A relationship between the grain size distributions may be first grain size distribution narrower than second grain size distribution, second grain size distribution narrower than third grain size distribution, and third grain size distribution narrower than fourth grain size distribution, as another example.

As a further example, the third electrode layer 502-3 may include a third electrical conductivity and the fourth electrode layer 502-4 may include a fourth electrical conductivity. A relationship between the electrical conductivities may be first electrical conductivity>second electrical conductivity>third electrical conductivity>fourth electrical conductivity, as an example. In some aspects a relationship between the electrical conductivities may be first electrical conductivity<second electrical conductivity<third electrical conductivity<fourth electrical conductivity, as another example.

As a further example, the third material may include a crystal structure having a third bond length and a third lattice constant, and the fourth material may include a crystal structure having a fourth bond length and a fourth lattice constant. A relationship between the bond lengths may be first bond length>second bond length>third bond length>fourth bond length, as an example, and/or a relationship between the lattice constants may be first lattice constant>second lattice constant>third lattice constant>fourth lattice constant. In some aspects, a relationship between the bond lengths may be first bond length<second bond length<third bond length<fourth bond length, as an example, and/or a relationship between the lattice constants may be first lattice constant<second lattice constant<third lattice constant<fourth lattice constant.

As a further example, the third material may include a third thickness, and the fourth material may include a fourth thickness. A relationship between the thicknesses of the electrode layers 502 may be first thickness>second thickness>third thickness>fourth thickness, as an example. In some aspects, a relationship between the thicknesses of the electrode layers 502 may be first thickness<second thickness<third thickness<fourth thickness, as another example.

As a further example, the third material may include a third weight percentage of oxygen, and the fourth material may include a fourth weight percentage of oxygen. A relationship between the weight percentages of oxygen of the electrode layers 502 may be first weight percentage of oxygen>second weight percentage of oxygen>third weight percentage of oxygen>fourth weight percentage of oxygen, as an example. In some aspects, relationship between the weight percentages of oxygen of the electrode layers 502 may be first weight percentage of oxygen<second weight percentage of oxygen<third weight percentage of oxygen<fourth weight percentage of oxygen, as another example.

In some aspects, each functional layer 504 (e.g., the first functional layer 504-1, the second functional layer 504-2, the third functional layer 504-3) may be adapted in accordance with the adjacent electrode layer(s). Illustratively, the properties of a functional layer 504-1, 504-2, 504-3 (e.g., the properties of a material of the functional layer 504-1, 504-2, 504-3) may be intermediate properties with respect to the adjacent electrode layer(s), that is the functional layer 504-1, 504-2, 504-3 may provide a transition region for providing the desired gradient, as described above.

In some aspects, each functional layer 504 (e.g., the first functional layer 504-1, the second functional layer 504-2, the third functional layer 504-3) may be configured to provide an oxygen diffusion barrier for the adjacent electrode layer(s), as described above.

Figure 6A:
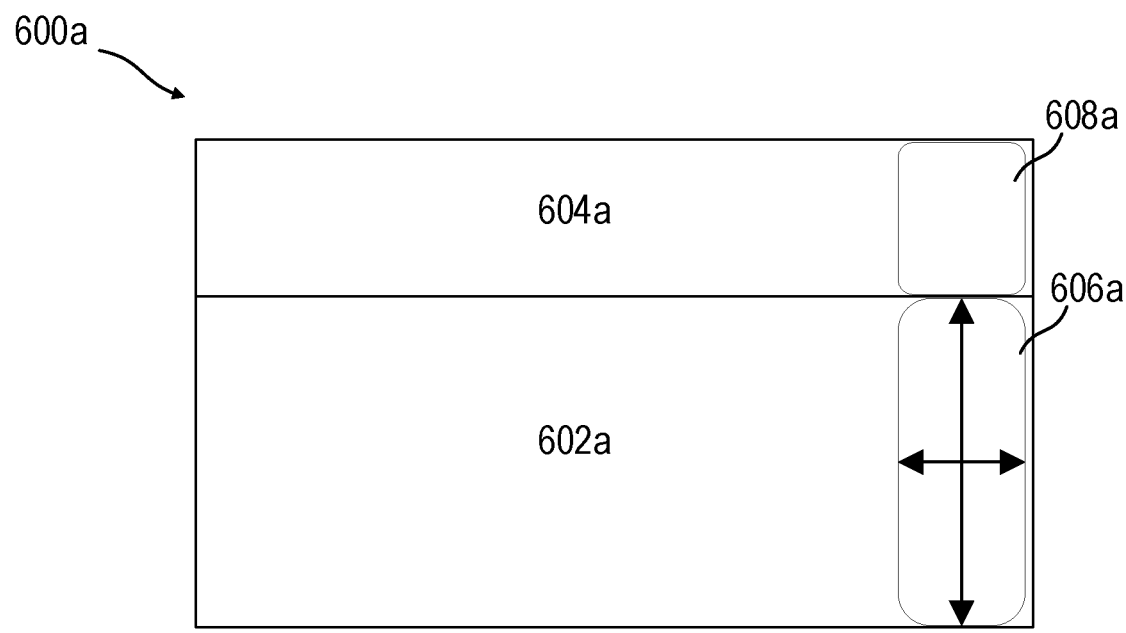
FIG. 6A and FIG. 6B each shows schematically a portion of a memory capacitor, according to various aspects.
Figure 6B:
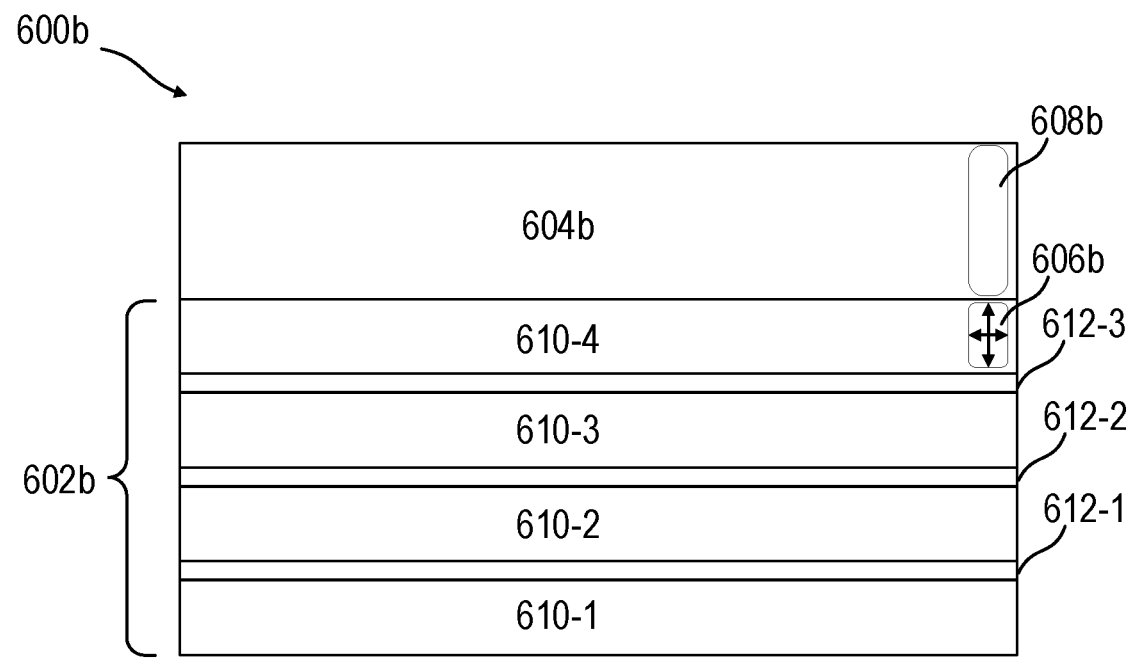

FIG. 6A and FIG. 6B each shows a respective portion of a memory capacitor 600a, 600b. The memory capacitor 600a may include an electrode 602a not adapted as described herein, whereas the memory capacitor 600b may include an electrode 602b adapted as described herein (illustratively, the electrode 602b may be configured as the electrode 500 described in relation to FIG. 5A to FIG. 5D).

The electrode 602a of the memory capacitor 600a may include a consecutive crystalline electrode layer, that is a continuous layer extending up to a memory structure 604a of the memory capacitor 600a (e.g., up to a remanent-polarizable layer, such as a ferroelectric layer). The material of the electrode 602a may include a plurality of grains 606a having a certain grain size (an average grain size), which may be relatively large compared to the grain size that may be obtained with the adapted electrode 602b, as described above.

The electrode 602b of the memory capacitor 600b may include a plurality (e.g., two or more, e.g., four or more) of electrode layers 610-1, 610-2, 610-3, 610-4, and a plurality (e.g., two or more, e.g., four or more) of functional layers 612-1, 612-2, 612-3 to provide a gradient of various properties across the electrode 602b, such that the electrode layer 610-4 in direct contact with a memory structure 604b of the memory capacitor 600b (e.g., in direct contact with a remanent-polarizable layer, such as a ferroelectric layer) may have desired properties. In the exemplary configuration shown in FIG. 6B, the electrode layers 610-1, 610-2, 610-3, 610-4 and the functional layers 612-1, 612-2, 612-3 may be configured to provide a gradient of average grain size across the electrode 602b, such that a material of the electrode layer 610-4 may include a plurality of grains 606b having a desired grain size, e.g. a relatively small grain size compared to the electrode 602a shown in FIG. 6A. This may provide that the memory structure 604b has desired properties, e.g. that a material of the memory structure has a plurality of grains 608b having a desired (e.g., relatively small) grain size.

Figure 7:
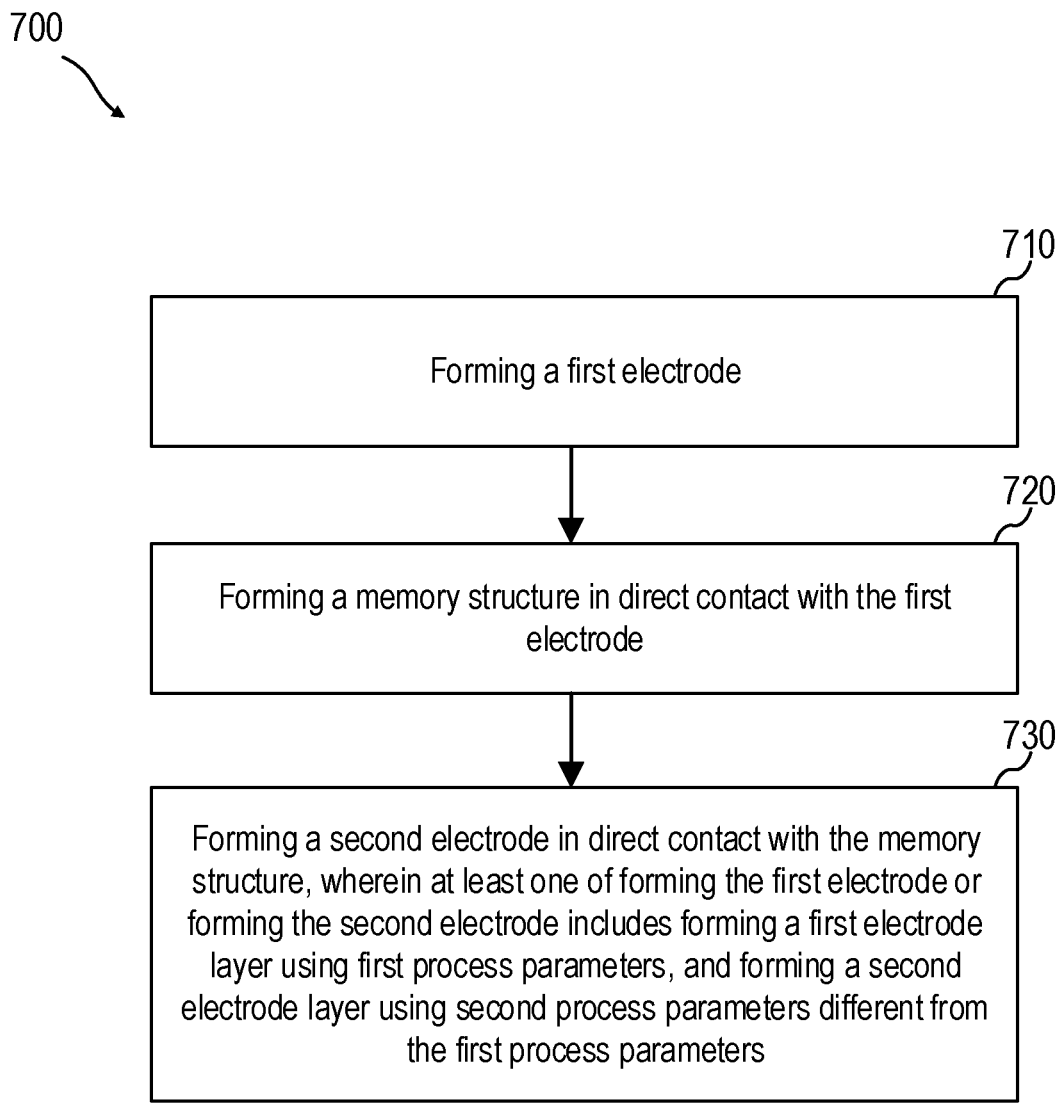
FIG. 7 shows a schematic flow diagram of a method of forming a memory capacitor, according to various aspects.

FIG. 7 illustrates a schematic flow diagram of a method 700 of forming a memory capacitor, according to various aspects. In some aspects, the method 700 of forming a memory capacitor may include one or more processes configured to form the electrode 500a, 500b, 500c, 500d as described herein.

According to various aspects, the method 700 of forming a memory capacitor may include: in 710, forming a first electrode, in 720 forming a memory structure in direct contact with the first electrode, and in 730 forming a second electrode in direct contact with the memory structure. The first electrode, the memory structure, and the second electrode may form the memory capacitor. At least one of forming the first electrode or forming the second electrode may include forming a first electrode layer using first process parameters and forming a second electrode layer using second process parameters different from the first process parameters. Illustratively, at least one of forming the first electrode or forming the second electrode may include varying the process parameters during forming the electrode to provide varying properties across the electrode, e.g. to provide a gradient of one or more properties across the electrode. In some aspects, the memory structure formed in process 720 of the method 700 may include a memory structure 324, 406, 504 as described herein. In some aspects, the first electrode formed in process 710 of the method 700 may include an electrode 322, 402, 500a, 500b, 500c, 500d as described herein. In some aspects, the second electrode formed in process 730 of the method 700 may include an electrode 326, 404, 500a, 500b, 500c, 500d as described herein. In some aspects, the memory capacitor formed in processes 710, 720, 730 of the method 700 may include a memory capacitor 200b, 302b, 400b, as described herein.

It may be understood that the method 700 is not limited to forming a first electrode layer and a second electrode layer, and may include, in some aspects, forming one or more further electrode layers (e.g., a third electrode layer, a fourth electrode layer, etc.), each associated with respective process parameters.

In some aspects, forming the memory structure 720 of the method 700 may include forming the memory structure in direct physical contact with the second electrode layer, and the second electrode layer may be configured to influence one or more properties of the memory structure during forming the memory structure. Illustratively, the second electrode layer may be configured to provide desired properties to the memory structure. In some aspects, forming the memory structure 720 of the method 700 may include epitaxially growing the memory structure on the second electrode layer.

In some aspects, the method 700 may include one or more layering and patterning processes for processing the memory capacitor, e.g. for forming the memory structure and/or the electrodes. In some aspects, a mask may be used. A mask may include a material that serves for transferring a photolithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g. wet or dry chemical etching). However, any other suitable process may be used to transfer a desired pattern into one or more material layers.

In various aspects, forming an electrode 710, 730 may include depositing a plurality of electrode layers or growing a plurality of electrode layers. The process parameters associated with an electrode layer may deposition parameters or growing parameters. The deposition or the growth of an electrode layer may be carried out with technologies known in the art, for example by means of sputtering, electron-beam evaporation, chemical vapor deposition, thermal vapor deposition, nucleation, and the like. In some aspects, the deposition or the growth of an electrode layer may be carried out in a vacuum chamber.

In some aspects, the process parameters associated with different electrode layers may differ in at least one of (e.g., the first process parameters may differ from the second process parameters in at least one of): a processing temperature, a processing pressure, a precursor material, a process gas (e.g., a flow of the process gas), and/or a partial pressure of a process gas. Illustratively, the method 700 may include one or more interruptions, or breaks, during forming one electrode to modify one or more process parameters associated with that electrode to provide a plurality of electrode layers within the electrode.

In some aspects, a processing temperature associated with an electrode layer may vary with respect to a processing temperature associated with the (immediately) preceding electrode layer by at least 5%, or at least 20%, or at least 50%, or at least 100%. As an example, a second temperature at which the second electrode layer is formed (e.g., deposited) may be 5% greater than a first temperature at which the first electrode layer is formed, in some aspects 10% greater, or 50% greater, or 100% greater. As another example, a second temperature at which the second electrode layer is formed (e.g., deposited) may be 5% less than a first temperature at which the first electrode layer is formed, in some aspects 10% less, or 50% less. The temperature may be increased or reduced in accordance with the properties to be provided in the formed electrode layer.

In some aspects, a processing pressure associated with an electrode layer may vary with respect to a processing pressure associated with the (immediately) preceding electrode layer by at least 5%, or at least 20%, or at least 50%, or at least 100%. As an example, a second pressure at which the second electrode layer is formed (e.g., deposited) may be 5% greater than a first pressure at which the first electrode layer is formed, in some aspects 10% greater, or 50% greater, or 100% greater. As another example, a second pressure at which the second electrode layer is formed (e.g., deposited) may be 5% less than a first pressure at which the first electrode layer is formed, in some aspects 10% less, or 50% less. The pressure may be increased or reduced in accordance with the properties to be provided in the formed electrode layer.

In some aspects, a precursor material used for forming an electrode layer may vary with respect to a precursor material associated with the (immediately) preceding electrode layer. Forming the first electrode layer may include using a first precursor material and forming the second electrode layer may include using a second precursor material different from the first precursor material. The first precursor material may differ from the second precursor material in at least one of: electrical conductivity, chemical composition, and/or content of the participating elements.

In some aspects, a process gas used during forming an electrode layer may vary with respect to a process gas used during forming the (immediately) preceding electrode layer. Forming the first electrode layer may include using a first process gas and forming the second electrode layer may include using a second process gas different from the first process gas. The first process gas may differ from the second process gas in at least one of: chemical composition, and/or content of the participating elements. In some aspects, a flow (e.g., a volume per minute or a volume per second) of a process gas used during forming an electrode layer may vary with respect to flow used during forming the (immediately) preceding electrode layer by at least 5%, or at least 20%, or at least 50%, or at least 100%. As an example, a second gas flow with which the second electrode layer is formed (e.g., deposited) may be 5% greater than a first gas flow with which the first electrode layer is formed, in some aspects 10% greater, or 50% greater, or 100% greater. As another example, a second gas flow with which the second electrode layer is formed (e.g., deposited) may be 5% less than a first gas flow which the first electrode layer is formed, in some aspects 10% less, or 50% less. The gas flow may be increased or reduced in accordance with the properties to be provided in the formed electrode layer.

In some aspects, an amount of oxygen used during forming an electrode layer (e.g., an amount of oxygen introduced in the vacuum chamber during forming the electrode layer) may vary with respect to an amount of oxygen associated with the (immediately) preceding electrode layer by at least 5%, or at least 20%, or at least 50%, or at least 100%. As an example, a second amount of oxygen used during forming the second electrode layer may be 5% greater than a first amount of oxygen used during forming the first electrode layer, in some aspects 10% greater, or 50% greater, or 100% greater. As another example, a second amount of oxygen used during forming the second electrode layer may be 5% less than a first amount of oxygen used during forming the first electrode layer, in some aspects 10% less, or 50% less. The amount of oxygen may be increased or reduced in accordance with the properties to be provided in the formed electrode layer.

In some aspects, a partial pressure of a process gas (e.g., oxygen) used during forming an electrode layer (e.g., a partial pressure of oxygen introduced in the vacuum chamber during forming the electrode layer) may vary with respect to a partial pressure of the process gas associated with the (immediately) preceding electrode layer by at least 5%, or at least 20%, or at least 50%, or at least 100%. As an example, a second partial pressure of oxygen used during forming the second electrode layer may be 5% greater than a first partial pressure of oxygen used during forming the first electrode layer, in some aspects 10% greater, or 50% greater, or 100% greater. As another example, a second partial pressure of oxygen used during forming the second electrode layer may be 5% less than a first partial pressure of oxygen used during forming the first electrode layer, in some aspects 10% less, or 50% less. The partial pressure may be increased or reduced in accordance with the properties to be provided in the formed electrode layer.

In some aspects, the method 700 may include forming a functional layer between two electrode layers, e.g., the method 700 may include forming a functional layer after forming the first electrode layer (e.g., a functional layer in direct contact with the first electrode) and prior to forming the second electrode layer (e.g., in direct contact with the functional layer). In some aspects, the functional layer formed in the method 700 may include a functional layer 504 as described herein. The functional layer may be configured to influence one or more properties of an electrode layer formed thereon, e.g. the functional layer may be configured to influence one or more properties of the second electrode layer during forming the second electrode layer.

In some aspects, forming a functional layer may include forming (e.g., depositing or growing) an additional layer over an electrode layer. In some aspects, forming a functional layer may include forming a monolayer of electrically insulating material (e.g., an electrically insulating oxide, such as aluminum oxide) over an electrode layer.

In some aspects, forming a functional layer may include inducing a transition (illustratively, a transformation) at the surface of an electrode layer prior to forming the subsequent electrode layer. Illustratively, forming a functional layer may include inducing forming an interface region on which a subsequent electrode layer may be formed. The interface region may be provided, for example, by a temperature treatment of an electrode layer, or by waiting for a predetermined waiting time prior to forming the subsequent electrode layer to allow the atoms at the surface of an electrode layer to assume a desired configuration.

In some aspects, the method 700 may include waiting for a predetermined waiting time between forming consecutive electrode layers, e.g. after forming the first electrode layer and prior to forming the second electrode layer. The predetermined waiting time may be sufficient to allow the formation of the desired interfacial properties at the surface of the first electrode layer. As a numerical example, the waiting time may be greater than 1 minute, greater than 10 minutes, or greater than 1 hour.

Figure 8:
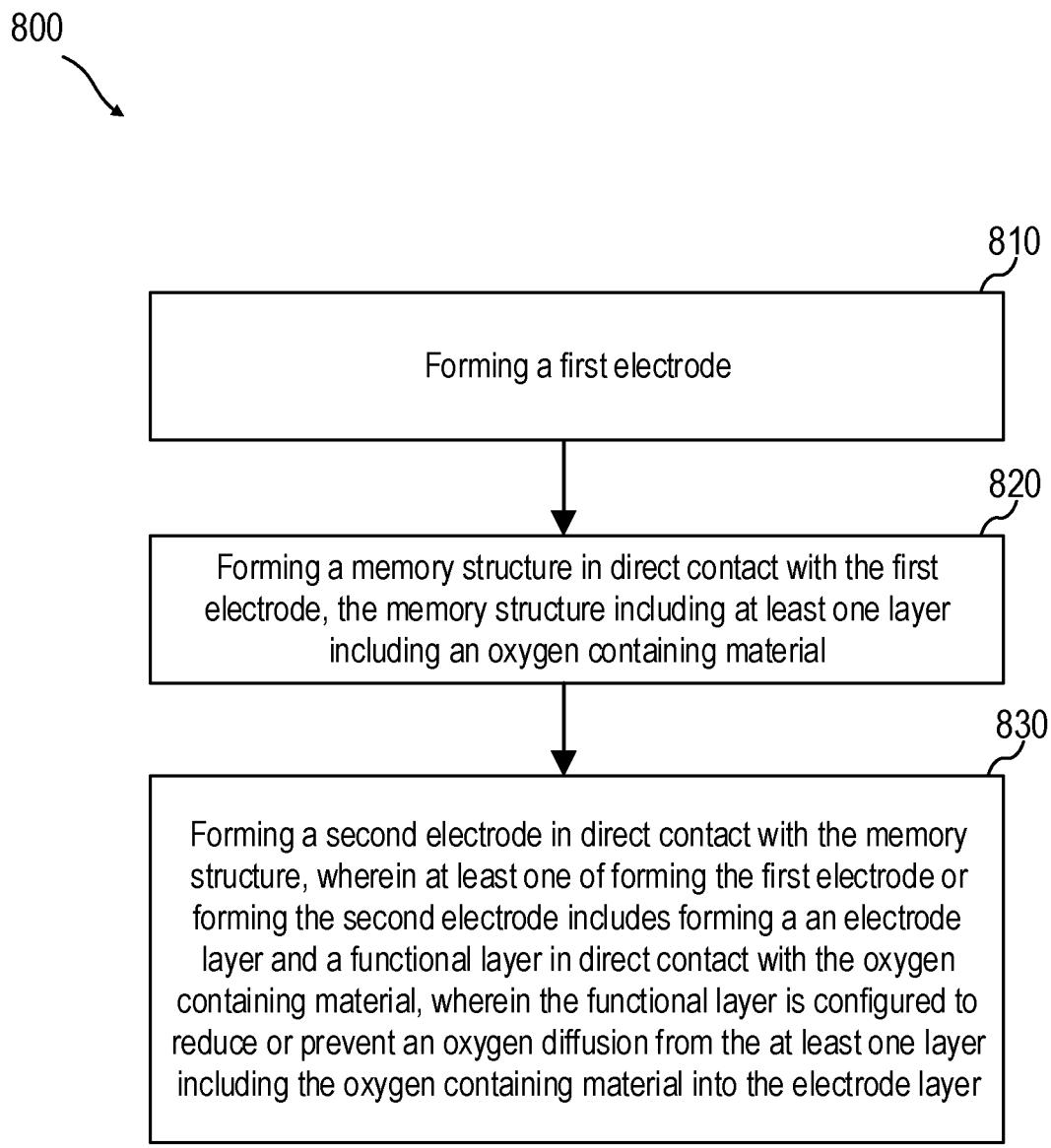
FIG. 8 shows a schematic flow diagram of a method of forming a memory capacitor, according to various aspects.

FIG. 8 illustrates a schematic flow diagram of a method 800 of forming a memory capacitor, according to various aspects. In some aspects, the method 800 of forming a memory capacitor may include one or more processes configured to form the electrode 500a, 500b, 500c, 500d as described herein.

According to various aspects, the method 800 of forming a memory capacitor may include: in 810, forming a first electrode, in 820 forming a memory structure in direct contact with the first electrode, the memory structure including at least one layer including an oxygen containing material; and in 830 forming a second electrode in direct contact with the memory structure. The first electrode, the memory structure, and the second electrode may form the memory capacitor. At least one of forming the first electrode or forming the second electrode may include forming an electrode layer and a functional layer in direct contact with the oxygen containing material, wherein the functional layer is configured to reduce or prevent an oxygen diffusion from the at least one layer including the oxygen containing material into the electrode layer. In some aspects, the memory structure formed in process 820 of the method 800 may include a memory structure 324, 406, 504 as described herein. In some aspects, the first electrode formed in process 810 of the method 800 may include an electrode 322, 402, 500a, 500b, 500c, 500d as described herein. In some aspects, the second electrode formed in process 830 of the method 800 may include an electrode 326, 404, 500a, 500b, 500c, 500d as described herein. In some aspects, the memory capacitor formed in processes 810, 820, 830 of the method 800 may include a memory capacitor 200b, 302b, 400b, as described herein.

According to various aspects, a memory cell as described herein may be integrated in an electronic device (e.g., e.g., a microcontroller, a central processing unit, a system on a chip (SoC), a memory device), for example in a same electronic device with other components, such as components to control logic operations and/or input/output operations of the electronic device. Illustratively, one or more memory transistors may be integrated (and formed) on or in a same carrier as one or more logic transistors and/or one or more input/output transistors.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means, in some aspects, that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier).

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g. parallel to the main processing surface) the "thickness" of the layer formed on the surface of the support may be the same as the height of the layer.

In the following, various aspects of this disclosure will be illustrated.

Example 1a is a memory cell including: a first electrode; a second electrode; and a memory structure disposed between the first electrode and the second electrode, the first electrode, the second electrode, and the memory structure forming a memory capacitor, wherein at least one of the first electrode or the second electrode includes: a first electrode layer including a first material having a first microstructure; a functional layer in direct contact with the first electrode layer; and a second electrode layer in direct contact with the functional layer, the second electrode layer including a second material having a second microstructure different from the first microstructure.

In Example 2a, the subject-matter of Example 1a may optionally further include that the first microstructure differs from the second microstructure in at least one of: granularity, average grain size, grain size distribution, number of grain boundaries, density of grain boundaries, shape of grain boundaries, chemical composition of grain boundaries, regions between two adjacent grains, content of defects, type of defects, and/or chemical composition of defects.

In Example 3a, the subject-matter of Example 1a or 2a may optionally further include that a first material of the first electrode layer includes a plurality of grains having a first average grain size and/or a first grain size distribution, that a second material of the second electrode layer includes a plurality of grains having a second average grain size and/or a second grain size distribution, and that the first average grain size is different from the second average grain size and/or the first grain size distribution is different from the second grain size distribution.

In Example 4a, the subject-matter of Example 3a may optionally further include that the second average grain size is less than the first average grain size, or that the second average grain size is greater than the first average grain size.

In Example 5a, the subject-matter of Example 3a or 4a may optionally further include that the first grain size distribution is broader than the second grain size distribution, or that the first grain size distribution is narrower than the second grain size distribution.

In Example 6a, the subject-matter of any one of Examples 1a to 5a may optionally further include that a material of the memory structure includes a plurality of grains having an average grain size substantially equal to an average grain size of a plurality of grains of the second material of the second electrode layer, and/or that the plurality of grains of the material of the memory structure have an average grain size different from (e.g., less than or greater than) an average grain size of a plurality of grains of the first material of the first electrode layer.

In Example 7a, the subject-matter of any one of Examples 1a to 6a may optionally further include that a first material of the first electrode layer has a first weight percentage of oxygen, and a second material of the second electrode layer has a second weight percentage of oxygen different from the first weight percentage of oxygen.

In Example 8a, the subject-matter of Example 7a may optionally further include that the first weight percentage of oxygen is less than the second weight percentage of oxygen, or that the second weight percentage of oxygen is greater than the first weight percentage of oxygen.

It is noted that a second weight percentage of oxygen may be regarded as different from a first weight percentage of oxygen at least in the case that the difference is greater than 1 weight percent, e.g., greater than 2 weight percent, e.g., greater than 5 weight percent, as examples.

In Example 9a, the subject-matter of any one of Examples 1a to 8a may optionally further include that the first material of the first electrode layer includes a first main component, and the second material of the second electrode layer includes a second main component different from the first main component.

In Example 10a, the subject-matter of Example 9a may optionally further include that the first material has a first chemical composition and the second material has a second chemical composition, and that the first chemical composition is different from the second chemical composition in at least one of doping and/or content of the participating elements.

In Example 11a, the subject-matter of any one of Examples 1a to 10a may optionally further include that the first material of the first electrode layer has a first crystal structure (e.g., one or more first crystal structure properties) and the second material of the second electrode layer has a second crystal structure (e.g., e.g., one or more second crystal structure properties) different from the first crystal structure.

In Example 12a, the subject-matter of any one of Examples 1a to 11a may optionally further include that the first material of the first electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 13a, the subject-matter of any one of Examples 1a to 12a may optionally further include that the second material of the second electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 14a, the subject-matter of any one of Examples 1a to 13a may optionally further include that the first electrode layer has a first thickness and the second electrode layer has a second thickness different from the first thickness.

In Example 15a, the subject-matter of Example 14a may optionally further include that the first thickness is less than the second thickness, or that the first thickness is greater than the second thickness.

In Example 16a, the subject-matter of any one of Examples 1a to 15a may optionally further include that the second electrode layer is disposed closer to the memory structure with respect to the first electrode layer.

In Example 17a, the subject-matter of Example 16a may optionally further include that the memory structure and the second electrode layer are in direct physical contact with one another.

In Example 18a, the subject-matter of any one of Examples 1a to 17a may optionally further include that the functional layer is an interface region between the first electrode layer and the second electrode layer, and includes an uppermost portion of the first electrode layer and a lowermost portion of the second electrode layer.

In Example 19a, the subject-matter of any one of Examples 1a to 18a may optionally further include that a thickness of the first functional layer is in the range from about 0.1 nm to about 5 nm, for example less than 0.5 nm or less than 0.2 nm.

In Example 20a, the subject-matter of any one of Examples 1a to 19a may optionally further include that the first electrode layer has a first electrical conductivity, and that the second electrode layer has a second electrical conductivity different from the first electrical conductivity.

In Example 21a, the subject-matter of Example 20a may optionally further include that the functional layer has an electrical conductivity less than the first electrical conductivity and less than the second electrical conductivity.

In Example 22a, the subject-matter of Example 20a or 21a may optionally further include that the second electrical conductivity is less than the first electrical conductivity, or that the second electrical conductivity is greater than the first electrical conductivity.

In Example 23a, the subject-matter of Example 22a may optionally further include that the second electrical conductivity is less than half of the first electrical conductivity, or that the second electrical conductivity is at least two times greater than the first electrical conductivity.

In Example 24a, the subject-matter of any one of Examples 1a to 23a may optionally further include that the functional layer is an oxygen absorbing layer or an oxygen diffusion barrier layer.

In Example 25a, the subject-matter of any one of Examples 1a to 24a may optionally further include that the first electrode layer includes a first rate of diffusion of oxygen and the second electrode layer includes a second rate of diffusion of oxygen different from the first rate of diffusion of oxygen.

In Example 26a, the subject-matter of Example 25a may optionally further include that the functional layer has a rate of diffusion of oxygen less than the first rate of diffusion of oxygen and less than the second rate of diffusion of oxygen.

In Example 27a, the subject-matter of Example 25a or 26a may optionally further include that the second rate of diffusion of oxygen is less than the first rate of diffusion of oxygen, or that the second rate of diffusion of oxygen is greater than the first rate of diffusion of oxygen.

In Example 28a, the subject-matter of Example 27a may optionally further include that the second rate of diffusion of oxygen is less than half of the first rate of diffusion of oxygen, or that the second rate of diffusion of oxygen is at least two times greater than the first rate of diffusion of oxygen.

In Example 29a, the subject-matter of any one of Examples 1a to 28a may optionally further include that a material of the functional layer includes at least one of an oxide, a nitride, or an oxynitride.

In some examples, a material of the functional layer may include at least one of Germanium (Ge), Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), Hafnium (Hf), Lanthanum (La), Nickel (Ni), Tantalum (Ta), Hafnium (Hf), Niobium (Nb), Zirconium (Zr), Indium (In), Vanadium (V), Silicon (S), and/or the respective oxide and/or the respective nitride.

In Example 30a, the subject-matter of any one of Examples 1a to 29a may optionally further include that the first electrode layer and the second electrode layer have a same lateral size.

In Example 31a, the subject-matter of any one of Examples 1a to 30a may optionally further include that the at least one of the first electrode and the second electrode further includes a second functional layer in direct contact with the second electrode layer; and a third electrode layer in direct contact with the second functional layer, the third electrode layer having a third microstructure different from the second microstructure and from the first microstructure.

In Example 32a, the subject-matter of any one of Examples 1a to 31a may optionally further include that the memory structure includes one or more remanent-polarizable layers.

In Example 33a, the subject-matter of Example 32a may optionally further include that a material of the one or more remanent-polarizable layers includes at least one of the following: hafnium oxide, zirconium oxide, a mixture of hafnium oxide and zirconium oxide.

In Example 34a, the subject-matter of any one of Examples 1a to 32a may optionally further include that the memory structure includes one or more spontaneously-polarizable layers and one or more charge storage layers.

In Example 35a, the subject-matter of any one of Examples 1a to 34a may optionally further include a field-effect transistor structure, the field-effect transistor structure including a gate structure coupled to the memory capacitor.

In Example 36a, the subject-matter of Example 35a may optionally further include that the memory capacitor and the field-effect transistor structure are coupled with one another to form a capacitive voltage divider.

In Example 37a, the subject-matter of Example 35a or 36a may optionally further include that the gate structure of the field-effect transistor structure includes a gate electrode and a gate isolation separating the gate electrode from a channel region of the field-effect transistor structure, and that the gate electrode is coupled to the first electrode of the memory capacitor.

In Example 38a, the subject-matter of Example 37a may optionally further include that the gate isolation extends from the channel region of the field-effect transistor structure to the gate electrode of the field-effect transistor structure.

In Example 39a, the subject-matter of any one of Examples 35a to 38a may optionally further include that the field-effect transistor structure includes a gate electrode layer and that the first electrode of the memory capacitor and the gate electrode layer are spatially separated from one another and electrically conductively connected to one another.

Example 1b is a memory cell including: a first electrode; a second electrode; and a memory structure disposed between the first electrode and the second electrode, the first electrode, the second electrode, and the memory structure forming a memory capacitor, wherein at least one of the first electrode or the second electrode includes: a first electrode layer; a functional layer in direct contact with the first electrode layer; and a second electrode layer in direct contact with the functional layer, wherein the functional layer is configured to reduce or prevent an oxygen diffusion from the second electrode layer into the first electrode layer.

In Example 2b, the subject-matter of Example 1b may optionally further include that a first material of the first electrode layer includes a first microstructure and a second material of the second electrode layer includes a second microstructure different from the first microstructure, and that the first microstructure differs from the second microstructure in at least one of: granularity, average grain size, grain size distribution, number of grain boundaries, density of grain boundaries, shape of grain boundaries, chemical composition of grain boundaries, regions between two adjacent grains, content of defects, type of defects, and/or chemical composition of defects.

In Example 3b, the subject-matter of Example 1b or 2b may optionally further include that a first material of the first electrode layer includes a plurality of grains having a first average grain size and/or a first grain size distribution, that a second material of the second electrode layer includes a plurality of grains having a second average grain size and/or a second grain size distribution, and that the first average grain size is different from the second average grain size and/or the first grain size distribution is different from the second grain size distribution.

In Example 4b, the subject-matter of Example 3b may optionally further include that the second average grain size is less than the first average grain size, or that the second average grain size is greater than the first average grain size.

In Example 5b, the subject-matter of Example 3b or 4b may optionally further include that the first grain size distribution is broader than the second grain size distribution, or that the first grain size distribution is narrower than the second grain size distribution.

In Example 6b, the subject-matter of any one of Examples 1b to 5b may optionally further include that a material of the memory structure includes a plurality of grains having an average grain size substantially equal to an average grain size of a plurality of grains of a second material of the second electrode layer, and that the plurality of grains of the material of the memory structure have an average grain size different from (e.g., less than or greater than) an average grain size of a plurality of grains of the first material of the first electrode layer.

In Example 7b, the subject-matter of any one of Examples 1b to 6b may optionally further include that a first material of the first electrode layer has a first weight percentage of oxygen, and a second material of the second electrode layer has a second weight percentage of oxygen different from the first weight percentage of oxygen.

In Example 8b, the subject-matter of Example 7b may optionally further include that the first weight percentage of oxygen is less than the second weight percentage of oxygen, or that the second weight percentage of oxygen is greater than the first weight percentage of oxygen.

In Example 9b, the subject-matter of any one of Examples 1b to 8b may optionally further include that the first material of the first electrode layer includes a first main component, and the second material of the second electrode layer includes a second main component different from the first main component.

In Example 10b, the subject-matter of Example 9b may optionally further include that the first material has a first chemical composition and the second material has a second chemical composition, and that the first chemical composition is different from the second chemical composition in at least one of doping and/or content of the participating elements.

In Example 11b, the subject-matter of any one of Examples 1b to 10b may optionally further include that the first material of the first electrode layer has a first crystal structure (e.g., one or more first crystal structure properties) and the second material of the second electrode layer has a second crystal structure (e.g., e.g., one or more second crystal structure properties) different from the first crystal structure.

In Example 12b, the subject-matter of any one of Examples 1b to 11b may optionally further include that the first material of the first electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 13b, the subject-matter of any one of Examples 1b to 12b may optionally further include that the second material of the second electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 14b, the subject-matter of any one of Examples 1b to 13b may optionally further include that the first electrode layer has a first thickness and the second electrode layer has a second thickness different from the first thickness.

In Example 15b, the subject-matter of Example 14b may optionally further include that the first thickness is less than the second thickness, or that the first thickness is greater than the second thickness.

In Example 16b, the subject-matter of any one of Examples 1b to 15b may optionally further include that the second electrode layer is disposed closer to the memory structure with respect to the first electrode layer.

In Example 17b, the subject-matter of Example 16b may optionally further include that the memory structure and the second electrode layer are in direct physical contact with one another.

In Example 18b, the subject-matter of any one of Examples 1b to 17b may optionally further include that the functional layer is an interface region between the first electrode layer and the second electrode layer, and includes an uppermost portion of the first electrode layer and a lowermost portion of the second electrode layer.

In Example 19b, the subject-matter of any one of Examples 1b to 18b may optionally further include that a thickness of the first functional layer is in the range from about 0.1 nm to about 5 nm, for example less than 0.5 nm or less than 0.2 nm.

In Example 20b, the subject-matter of any one of Examples 1b to 19b may optionally further include that the first electrode layer has a first electrical conductivity, the second electrode layer has a second electrical conductivity different from the first electrical conductivity.

In Example 21b, the subject-matter of Example 20b may optionally further include that the functional layer has an electrical conductivity less than the first electrical conductivity and less than the second electrical conductivity.

In Example 22b, the subject-matter of Example 20b or 21b may optionally further include that the second electrical conductivity is less than the first electrical conductivity, or that the second electrical conductivity is greater than the first electrical conductivity.

In Example 23b, the subject-matter of Example 22b may optionally further include that the second electrical conductivity is less than half of the first electrical conductivity, or that the second electrical conductivity is at least two times greater than the first electrical conductivity.

In Example 24b, the subject-matter of any one of Examples 1b to 23b may optionally further include that the functional layer is an oxygen absorbing layer or an oxygen diffusion barrier layer.

In Example 25b, the subject-matter of any one of Examples 1b to 24b may optionally further include that the first electrode layer includes a first rate of diffusion of oxygen and the second electrode layer includes a second rate of diffusion of oxygen different from the first rate of diffusion of oxygen.

In Example 26b, the subject-matter of Example 25b may optionally further include that the functional layer has a rate of diffusion of oxygen less than the first rate of diffusion of oxygen and less than the second rate of diffusion of oxygen.

In Example 27b, the subject-matter of Example 25b or 26b may optionally further include that the second rate of diffusion of oxygen is less than the first rate of diffusion of oxygen, or that the second rate of diffusion of oxygen is greater than the first rate of diffusion of oxygen.

In Example 28b, the subject-matter of Example 27b may optionally further include that the second rate of diffusion of oxygen is less than half of the first rate of diffusion of oxygen, or that the second rate of diffusion of oxygen is at least two times greater than the first rate of diffusion of oxygen.

In Example 29b, the subject-matter of any one of Examples 1b to 28b may optionally further include that a material of the functional layer includes at least one of an oxide, a nitride, or an oxynitride.

In some examples, a material of the functional layer may include at least one of Germanium (Ge), Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), Hafnium (Hf), Lanthanum (La), Nickel (Ni), Tantalum (Ta), Hafnium (Hf), Niobium (Nb), Zirconium (Zr), Indium (In), Vanadium (V), Silicon (S), and/or the respective oxide and/or the respective nitride.

In Example 30b, the subject-matter of any one of Examples 1b to 29b may optionally further include that the first electrode layer and the second electrode layer have a same lateral size.

In Example 31b, the subject-matter of any one of Examples 1b to 30b may optionally further include that the at least one of the first electrode and the second electrode further includes a second functional layer in direct contact with the second electrode layer; and a third electrode layer in direct contact with the second functional layer, the third electrode layer having a third microstructure different from the second microstructure and from the first microstructure.

In Example 32b, the subject-matter of any one of Examples 1b to 31b may optionally further include that the memory structure includes one or more remanent-polarizable layers.

In Example 33b, the subject-matter of Example 32b may optionally further include that a material of the one or more remanent-polarizable layers includes at least one of the following: hafnium oxide, zirconium oxide, a mixture of hafnium oxide and zirconium oxide.

In Example 34b, the subject-matter of any one of Examples 1b to 32b may optionally further include that the memory structure includes one or more spontaneously-polarizable layers and one or more charge storage layers.

In Example 35b, the subject-matter of any one of Examples 1b to 34b may optionally further include a field-effect transistor structure, the field-effect transistor structure including a gate structure coupled to the memory capacitor.

In Example 36b, the subject-matter of Example 35b may optionally further include that the memory capacitor and the field-effect transistor structure are coupled with one another to form a capacitive voltage divider.

In Example 37b, the subject-matter of Example 35b or 36b may optionally further include that the gate structure of the field-effect transistor structure includes a gate electrode and a gate isolation separating the gate electrode from a channel region of the field-effect transistor structure, and that the gate electrode is coupled to the first electrode of the memory capacitor.

In Example 38b, the subject-matter of Example 37b may optionally further include that the gate isolation extends from the channel region of the field-effect transistor structure to the gate electrode of the field-effect transistor structure.

In Example 39b, the subject-matter of any one of Examples 35b to 38b may optionally further include that the field-effect transistor structure includes a gate electrode layer and that the first electrode of the memory capacitor and the gate electrode layer are spatially separated from one another and electrically conductively connected to one another.

Example 1c is a memory cell including: a first electrode; a second electrode; and a memory structure disposed between the first electrode and the second electrode, the first electrode, the second electrode, and the memory structure forming a memory capacitor, the memory structure including at least one layer including an oxygen containing material, wherein at least one of the first electrode or the second electrode includes: an electrode layer; and a functional layer in direct contact with the electrode layer and with the at least one layer including the oxygen containing material, wherein the functional layer is configured to reduce or prevent an oxygen diffusion from the at least one layer including the oxygen containing material into the electrode layer.

In Example 2c, the subject-matter of Example 1c may optionally further include that a first material of the first electrode layer includes a first microstructure and a second material of the second electrode layer includes a second microstructure different from the first microstructure, and that the first microstructure differs from the second microstructure in at least one of: granularity, average grain size, grain size distribution, number of grain boundaries, density of grain boundaries, shape of grain boundaries, chemical composition of grain boundaries, regions between two adjacent grains, content of defects, type of defects, and/or chemical composition of defects.

In Example 3c, the subject-matter of Example 1c or 2c may optionally further include that a first material of the first electrode layer includes a plurality of grains having a first average grain size and/or a first grain size distribution, that a second material of the second electrode layer includes a plurality of grains having a second average grain size and/or a second grain size distribution, and that the first average grain size is different from the second average grain size and/or the first grain size distribution is different from the second grain size distribution.

In Example 4c, the subject-matter of Example 3c may optionally further include that the second average grain size is less than the first average grain size, or that the second average grain size is greater than the first average grain size.

In Example 5c, the subject-matter of Example 3c or 4c may optionally further include that the first grain size distribution is broader than the second grain size distribution, or that the first grain size distribution is narrower than the second grain size distribution.

In Example 6c, the subject-matter of any one of Examples 1c to 5c may optionally further include that a material of the memory structure includes a plurality of grains having an average grain size substantially equal to an average grain size of a plurality of grains of a second material of the second electrode layer, and that the plurality of grains of the material of the memory structure have an average grain size different from (e.g., less than or greater than) an average grain size of a plurality of grains of the first material of the first electrode layer.

In Example 7c, the subject-matter of any one of Examples 1c to 6c may optionally further include that a first material of the first electrode layer has a first weight percentage of oxygen, and a second material of the second electrode layer has a second weight percentage of oxygen different from the first weight percentage of oxygen.

In Example 8c, the subject-matter of Example 7c may optionally further include that the first weight percentage of oxygen is less than the second weight percentage of oxygen, or that the second weight percentage of oxygen is greater than the first weight percentage of oxygen.

In Example 9c, the subject-matter of any one of Examples 1c to 8c may optionally further include that the first material of the first electrode layer includes a first main component, and the second material of the second electrode layer includes a second main component different from the first main component.

In Example 10c, the subject-matter of Example 9c may optionally further include that the first material has a first chemical composition and the second material has a second chemical composition, and that the first chemical composition is different from the second chemical composition in at least one of doping and/or content of the participating elements.

In Example 11c, the subject-matter of any one of Examples 1c to 10c may optionally further include that the first material of the first electrode layer has a first crystal structure (e.g., one or more first crystal structure properties) and the second material of the second electrode layer has a second crystal structure (e.g., e.g., one or more second crystal structure properties) different from the first crystal structure.

In Example 12c, the subject-matter of any one of Examples 1c to 11c may optionally further include that the first material of the first electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 13c, the subject-matter of any one of Examples 1c to 12c may optionally further include that the second material of the second electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 14c, the subject-matter of any one of Examples 1c to 13c may optionally further include that the first electrode layer has a first thickness and the second electrode layer has a second thickness different from the first thickness.

In Example 15c, the subject-matter of Example 14c may optionally further include that the first thickness is less than the second thickness, or that the first thickness is greater than the second thickness.

In Example 16c, the subject-matter of any one of Examples 1c to 15c may optionally further include that the second electrode layer is disposed closer to the memory structure with respect to the first electrode layer.

In Example 17c, the subject-matter of Example 16c may optionally further include that the memory structure and the second electrode layer are in direct physical contact with one another.

In Example 18c, the subject-matter of any one of Examples 1c to 17c may optionally further include that the functional layer is an interface region between the first electrode layer and the second electrode layer, and includes an uppermost portion of the first electrode layer and a lowermost portion of the second electrode layer.

In Example 19c, the subject-matter of any one of Examples 1c to 18c may optionally further include that a thickness of the first functional layer is in the range from about 0.1 nm to about 5 nm, for example less than 0.5 nm or less than 0.2 nm.

In Example 20c, the subject-matter of any one of Examples 1c to 19c may optionally further include that the first electrode layer has a first electrical conductivity, the second electrode layer has a second electrical conductivity different from the first electrical conductivity.

In Example 21c, the subject-matter of Example 20c may optionally further include that the functional layer has an electrical conductivity less than the first electrical conductivity and less than the second electrical conductivity.

In Example 22c, the subject-matter of Example 20c or 21c may optionally further include that the second electrical conductivity is less than the first electrical conductivity, or that the second electrical conductivity is greater than the first electrical conductivity.

In Example 23c, the subject-matter of Example 22c may optionally further include that the second electrical conductivity is less than half of the first electrical conductivity, or that the second electrical conductivity is at least two times greater than the first electrical conductivity.

In Example 24c, the subject-matter of any one of Examples 1c to 23c may optionally further include that the functional layer is an oxygen absorbing layer or an oxygen diffusion barrier layer.

In Example 25c, the subject-matter of any one of Examples 1c to 24c may optionally further include that the first electrode layer includes a first rate of diffusion of oxygen and the second electrode layer includes a second rate of diffusion of oxygen different from the first rate of diffusion of oxygen.

In Example 26c, the subject-matter of Example 25c may optionally further include that the functional layer has a rate of diffusion of oxygen less than the first rate of diffusion of oxygen and less than the second rate of diffusion of oxygen.

In Example 27c, the subject-matter of Example 25c or 26c may optionally further include that the second rate of diffusion of oxygen is less than the first rate of diffusion of oxygen, or that the second rate of diffusion of oxygen is greater than the first rate of diffusion of oxygen.

In Example 28c, the subject-matter of Example 27c may optionally further include that the second rate of diffusion of oxygen is less than half of the first rate of diffusion of oxygen, or that the second rate of diffusion of oxygen is at least two times greater than the first rate of diffusion of oxygen.

In Example 29c, the subject-matter of any one of Examples 1c to 28c may optionally further include that a material of the functional layer includes at least one of an oxide, a nitride, or an oxynitride.

In some examples, a material of the functional layer may include at least one of Germanium (Ge), Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), Hafnium (Hf), Lanthanum (La), Nickel (Ni), Tantalum (Ta), Hafnium (Hf), Niobium (Nb), Zirconium (Zr), Indium (In), Vanadium (V), Silicon (S), and/or the respective oxide and/or the respective nitride.

In Example 30c, the subject-matter of any one of Examples 1c to 29c may optionally further include that the first electrode layer and the second electrode layer have a same lateral size.

In Example 31c, the subject-matter of any one of Examples 1c to 30c may optionally further include that the at least one of the first electrode and the second electrode further includes a second functional layer in direct contact with the second electrode layer; and a third electrode layer in direct contact with the second functional layer, the third electrode layer having a third microstructure different from the second microstructure and from the first microstructure.

In Example 32c, the subject-matter of any one of Examples 1c to 31c may optionally further include that the memory structure includes one or more remanent-polarizable layers.

In Example 33c, the subject-matter of Example 32c may optionally further include that a material of the one or more remanent-polarizable layers includes at least one of the following: hafnium oxide, zirconium oxide, a mixture of hafnium oxide and zirconium oxide.

In Example 34c, the subject-matter of any one of Examples 1c to 32c may optionally further include that the memory structure includes one or more spontaneously-polarizable layers and one or more charge storage layers.

In Example 35c, the subject-matter of any one of Examples 1c to 34c may optionally further include a field-effect transistor structure, the field-effect transistor structure including a gate structure coupled to the memory capacitor.

In Example 36c, the subject-matter of Example 35c may optionally further include that the memory capacitor and the field-effect transistor structure are coupled with one another to form a capacitive voltage divider.

In Example 37c, the subject-matter of Example 35c or 36c may optionally further include that the gate structure of the field-effect transistor structure includes a gate electrode and a gate isolation separating the gate electrode from a channel region of the field-effect transistor structure, and that the gate electrode is coupled to the first electrode of the memory capacitor.

In Example 38c, the subject-matter of Example 37c may optionally further include that the gate isolation extends from the channel region of the field-effect transistor structure to the gate electrode of the field-effect transistor structure.

In Example 39c, the subject-matter of any one of Examples 35c to 38c may optionally further include that the field-effect transistor structure includes a gate electrode layer and that the first electrode of the memory capacitor and the gate electrode layer are spatially separated from one another and electrically conductively connected to one another.

Example 1d is a memory cell including: a first electrode; a second electrode; and a memory structure disposed between the first electrode and the second electrode, the first electrode, the second electrode, and the memory structure forming a memory capacitor, wherein at least one of the first electrode or the second electrode includes: a first electrode layer having a first electrical conductivity; a functional layer in direct contact with the first electrode layer; and a second electrode layer in direct contact with the functional layer, the second electrode layer having a second electrical conductivity less than the first electrical conductivity.

In Example 2d, the subject-matter of Example 1d may optionally further include that a first material of the first electrode layer includes a first microstructure and a second material of the second electrode layer includes a second microstructure different from the first microstructure, and that the first microstructure differs from the second microstructure in at least one of: granularity, average grain size, grain size distribution, number of grain boundaries, density of grain boundaries, shape of grain boundaries, chemical composition of grain boundaries, regions between two adjacent grains, content of defects, type of defects, and/or chemical composition of defects.

In Example 3d, the subject-matter of Example 1d or 2d may optionally further include that a first material of the first electrode layer includes a plurality of grains having a first average grain size and/or a first grain size distribution, that a second material of the second electrode layer includes a plurality of grains having a second average grain size and/or a second grain size distribution, and that the first average grain size is different from the second average grain size and/or the first grain size distribution is different from the second grain size distribution. In some aspects, a first material of the first electrode layer includes a first crystallographic texture and a second material of the second electrode layer includes a second crystallographic texture different from the first crystallographic texture.

In Example 4d, the subject-matter of Example 3d may optionally further include that the second average grain size is less than the first average grain size, or that the second average grain size is greater than the first average grain size.

In Example 5d, the subject-matter of Example 3d or 4d may optionally further include that the first grain size distribution is broader than the second grain size distribution, or that the first grain size distribution is narrower than the second grain size distribution.

In Example 6d, the subject-matter of any one of Examples 1d to 5d may optionally further include that a material of the memory structure includes a plurality of grains having an average grain size substantially equal to an average grain size of a plurality of grains of a second material of the second electrode layer, and that the plurality of grains of the material of the memory structure have an average grain size different from (e.g., less than or greater than) an average grain size of a plurality of grains of the first material of the first electrode layer.

In Example 7d, the subject-matter of any one of Examples 1d to 6d may optionally further include that a first material of the first electrode layer has a first weight percentage of oxygen, and a second material of the second electrode layer has a second weight percentage of oxygen different from the first weight percentage of oxygen.

In Example 8d, the subject-matter of Example 7d may optionally further include that the first weight percentage of oxygen is less than the second weight percentage of oxygen, or that the second weight percentage of oxygen is greater than the first weight percentage of oxygen.

In Example 9d, the subject-matter of any one of Examples 1d to 8d may optionally further include that the first material of the first electrode layer includes a first main component, and the second material of the second electrode layer includes a second main component different from the first main component.

In Example 10d, the subject-matter of Example 9d may optionally further include that the first material has a first chemical composition and the second material has a second chemical composition, and that the first chemical composition is different from the second chemical composition in at least one of doping and/or content of the participating elements.

In Example 11d, the subject-matter of any one of Examples 1d to 10d may optionally further include that the first material of the first electrode layer has a first crystal structure (e.g., one or more first crystal structure properties) and the second material of the second electrode layer has a second crystal structure (e.g., e.g., one or more second crystal structure properties) different from the first crystal structure.

In Example 12d, the subject-matter of any one of Examples 1d to 11d may optionally further include that the first material of the first electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 13d, the subject-matter of any one of Examples 1d to 12d may optionally further include that the second material of the second electrode layer includes at least one of: Platinum, Iridium, Rhenium, Rhodium, Ruthenium, Titanium, Osmium, Molybdenum, Chromium, Tungsten, Aluminum, Gold, Cobalt.

In Example 14d, the subject-matter of any one of Examples 1d to 13d may optionally further include that the first electrode layer has a first thickness and the second electrode layer has a second thickness different from the first thickness.

In Example 15d, the subject-matter of Example 14d may optionally further include that the first thickness is less than the second thickness, or that the first thickness is greater than the second thickness.

In Example 16d, the subject-matter of any one of Examples 1d to 15d may optionally further include that the second electrode layer is disposed closer to the memory structure with respect to the first electrode layer.

In Example 17d, the subject-matter of Example 16d may optionally further include that the memory structure and the second electrode layer are in direct physical contact with one another.

In Example 18d, the subject-matter of any one of Examples 1d to 17d may optionally further include that the functional layer is an interface region between the first electrode layer and the second electrode layer, and includes an uppermost portion of the first electrode layer and a lowermost portion of the second electrode layer.

In Example 19d, the subject-matter of any one of Examples 1d to 18d may optionally further include that a thickness of the first functional layer is in the range from about 0.1 nm to about 5 nm, for example less than 0.5 nm or less than 0.2 nm.

In Example 20d, the subject-matter of any one of Examples 1d to 19d may optionally further include that the functional layer has an electrical conductivity less than the first electrical conductivity and less than the second electrical conductivity.

In Example 21d, the subject-matter of Example 20d may optionally further include that the functional layer has an electrical conductivity at least 10 orders of magnitude less than the first electrical conductivity and at least 10 orders of magnitude less than the second electrical conductivity.

In Example 22d, the subject-matter of Example 20d or 21d may optionally further include that the second electrical conductivity is less than half of the first electrical conductivity In Example 23d, the subject-matter of any one of Examples 1d to 22d may optionally further include that the second electrical conductivity is one order of magnitude less than the first electrical conductivity.

In Example 24d, the subject-matter of any one of Examples 1d to 23d may optionally further include that the functional layer is an oxygen absorbing layer or an oxygen diffusion barrier layer.

In Example 25d, the subject-matter of any one of Examples 1d to 24d may optionally further include that the first electrode layer includes a first rate of diffusion of oxygen and the second electrode layer includes a second rate of diffusion of oxygen different from the first rate of diffusion of oxygen.

In Example 26d, the subject-matter of Example 25d may optionally further include that the functional layer has a rate of diffusion of oxygen less than the first rate of diffusion of oxygen and less than the second rate of diffusion of oxygen.

In Example 27d, the subject-matter of Example 25d or 26d may optionally further include that the second rate of diffusion of oxygen is less than the first rate of diffusion of oxygen, or that the second rate of diffusion of oxygen is greater than the first rate of diffusion of oxygen.

In Example 28d, the subject-matter of Example 27d may optionally further include that the second rate of diffusion of oxygen is less than half of the first rate of diffusion of oxygen, or that the second rate of diffusion of oxygen is at least two times greater than the first rate of diffusion of oxygen.

In Example 29d, the subject-matter of any one of Examples 1d to 28d may optionally further include that a material of the functional layer includes at least one of an oxide, a nitride, or an oxynitride.

In some examples, a material of the functional layer may include at least one of Germanium (Ge), Platinum (Pt), Iridium (Ir), Rhenium (Re), Rhodium (Rh), Ruthenium (Ru), Titanium (Ti), Osmium (Os), Molybdenum (Mo), Chromium (Cr), Tungsten (W), Aluminum (Al), Gold (Au), Cobalt (Co), Hafnium (Hf), Lanthanum (La), Nickel (Ni), Tantalum (Ta), Hafnium (Hf), Niobium (Nb), Zirconium (Zr), Indium (In), Vanadium (V), Silicon (S), and/or the respective oxide and/or the respective nitride.

In Example 30d, the subject-matter of any one of Examples 1d to 29d may optionally further include that the first electrode layer and the second electrode layer have a same lateral size.

In Example 31d, the subject-matter of any one of Examples 1d to 30d may optionally further include that the at least one of the first electrode and the second electrode further includes a second functional layer in direct contact with the second electrode layer; and a third electrode layer in direct contact with the second functional layer, the third electrode layer having a third microstructure different from the second microstructure and from the first microstructure.

In Example 32d, the subject-matter of any one of Examples 1d to 31d may optionally further include that the memory structure includes one or more remanent-polarizable layers.

In Example 33d, the subject-matter of Example 32d may optionally further include that a material of the one or more remanent-polarizable layers includes at least one of the following: hafnium oxide, zirconium oxide, a mixture of hafnium oxide and zirconium oxide.

In Example 34d, the subject-matter of any one of Examples 1d to 32d may optionally further include that the memory structure includes one or more spontaneously-polarizable layers and one or more charge storage layers.

In Example 35d, the subject-matter of any one of Examples 1d to 34d may optionally further include a field-effect transistor structure, the field-effect transistor structure including a gate structure coupled to the memory capacitor.

In Example 36d, the subject-matter of Example 35d may optionally further include that the memory capacitor and the field-effect transistor structure are coupled with one another to form a capacitive voltage divider.

In Example 37d, the subject-matter of Example 35d or 36d may optionally further include that the gate structure of the field-effect transistor structure includes a gate electrode and a gate isolation separating the gate electrode from a channel region of the field-effect transistor structure, and that the gate electrode is coupled to the first electrode of the memory capacitor.

In Example 38d, the subject-matter of Example 37d may optionally further include that the gate isolation extends from the channel region of the field-effect transistor structure to the gate electrode of the field-effect transistor structure.

In Example 39d, the subject-matter of any one of Examples 35d to 38d may optionally further include that the field-effect transistor structure includes a gate electrode layer and that the first electrode of the memory capacitor and the gate electrode layer are spatially separated from one another and electrically conductively connected to one another.

Example 1e is a method of forming a memory capacitor, the method including: forming a first electrode; forming a memory structure in direct contact with the first electrode; and forming a second electrode in direct contact with the memory structure, wherein at least one of forming the first electrode or forming the second electrode includes forming a first electrode layer using first process parameters, and forming a second electrode layer using second process parameters different from the first process parameters.

In Example 2e, the subject-matter of Example 1e may optionally further include that the first process parameters differ from the second process parameters in at least one of: a processing temperature, a processing pressure, a precursor material, a process gas (e.g., a flow of process gas), and/or a partial pressure of a process gas.

In Example 3e, the subject-matter of Example 1e or 2e may optionally further include that a first processing temperature at which the first electrode layer is formed is different from a second processing temperature at which the second electrode layer is formed by at least 5% or at least 50%.

In Example 4e, the subject-matter of any one of Examples 1e to 3e may optionally further include that a first processing pressure at which the first electrode layer is formed is different from a second processing pressure at which the second electrode layer is formed by at least 5% or at least 50%.

In Example 5e, the subject-matter of any one of Examples 1e to 4e may optionally further include that a first precursor material used for forming the first electrode layer differs from a second precursor material used for forming the second electrode layer in at least one of: electrical conductivity, chemical composition, and/or content of the participating elements.

In Example 6e, the subject-matter of any one of Examples 1e to 5e may optionally further include that a first process gas used for forming the first electrode layer differs from a second process gas used for forming the second electrode layer in at least one of: chemical composition, and/or content of the participating elements.

In Example 7e, the subject-matter of any one of Examples 1e to 6e may optionally further include that a first amount of oxygen used for forming the first electrode layer is different from a second amount of oxygen used for forming the second electrode layer by at least 5% or at least 50%.

In Example 8e, the subject-matter of any one of Examples 1e to 7e may optionally further include that a first partial pressure of oxygen used during forming the first electrode layer is different from a second partial pressure of oxygen used during forming the second electrode layer by at least 5% or at least 50%.

In Example 9e, the subject-matter of any one of Examples 1e to 8e may optionally further include waiting for a predetermined waiting time after forming the first electrode layer and prior to forming the second electrode layer.

In Example 10e, the subject-matter of Example 9e may optionally further include that the predetermined waiting time is greater than 1 minute.

In Example 11e, the subject-matter of any one of Examples 1e to 10e may optionally further include forming a functional layer in direct contact with the first electrode layer prior to forming the second electrode layer, and forming the second electrode layer in direct contact with the functional layer.

In Example 12e, the subject-matter of Example 11e may optionally further include that the functional layer is configured to influence one or more properties of the second electrode layer during forming the second electrode layer.

In Example 13e, the subject-matter of any one of Examples 1e to 12e may optionally further include forming the memory structure in direct contact with the second electrode layer, and that the second electrode layer is configured to influence the properties of the memory structure during the forming of the memory structure.

Example 1f is a method of forming a memory capacitor, the method including: forming a first electrode; forming a memory structure in direct contact with the first electrode, the memory structure including at least one layer including an oxygen containing material; and forming a second electrode in direct contact with the memory structure, wherein at least one of forming the first electrode or forming the second electrode includes forming a an electrode layer and a functional layer in direct contact with the oxygen containing material, wherein the functional layer is configured to reduce or prevent an oxygen diffusion from the at least one layer including the oxygen containing material into the electrode layer.

The method according to Example 1f may include one or more or each of the features described in relation to the method according to Examples 1e to 13e, where appropriate.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

It may be understood, that the physical properties "average grain size" and/or "grain size distribution" may be determined based on various measurements and/or calculations. As an example, a volume-weighted average grain size may be determined by known formulas. In some aspects, an average grain size may be determined by the known linear intercept method. Preferably, a measurement may be performed in accordance with the ASTM E1382 (e.g., as valid from 2015) standard. However, in a thin layer, e.g., in a layer with a thickness below 1 µm, a TEM cross-section image may be used as a basis to determine the "average grain size" and/or "grain size distribution" at least in two dimensions. This two-dimensional determination may allow estimating or deducting the three-dimensional properties assuming, for example, that a two-dimensional image is (statistically) representative for substantially all directions in the layer. It may be understood, that the term "grain size distribution" may define a spatial distribution, e.g., a distribution along a line, in a plane, or in a volume. It may be understood, that the term "grain size distribution" may define a frequency distribution, e.g., a histogram including number of grains having a grain-size in a certain range.

It may be understood, that the term "density of grain boundaries" may be defined by a number of grain boundaries per volume and/or by a volume fraction comparing the volume of the grain boundaries with a reference volume.

It may be understood, that the term "chemical composition of grain boundaries" may consider that a grain boundary may include another material than the corresponding grains. As an example, the oxygen content in a grain boundary may be different from the oxygen content of the actual corresponding grains.

It may be understood, that the term "chemical composition of defects" may consider that defects may include impurities. As an example, the material causing impurities may have another chemical composition than the material in the surrounding of the impurities.

It may be understood, that a specific type of crystallinity of a material may be a microstructural property. Type of crystallinity may include, for example: single crystalline, poly-crystalline, nano-crystalline, and, as an edge case, amorphous structures, as examples.

Various aspects relate to adapting or controlling microstructural properties of a material. The crystallographic texture is a microstructural property that can be controlled by during forming an electrode and/or by choosing a suitable design for the electrode, e.g., a multilayer design. According to various aspects, a texture of a top electrode layer may be induced by forming several succeeding electrode layers, as described herein.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^5$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^5$ S/m at a temperature of 20° C. The terms "electrically insulating" or "electrically isolating" may be used herein interchangeably to describe a material or a layer having an electrical conductivity or an average electrical conductivity less than $10^{-7}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{12}$ S/m at a temperature of 20° C.

The term "content" may be used herein, in some aspects, in relation to the "content of an element" in a material or in a layer to describe the mass percentage (or fraction) of that element over a total mass of the material (or of the layer). The term "content" may be used herein in relation to the "content of defects" in the structure of a material to describe the mass percentage of the defects over a total mass of the constituents of the structure. The term "content" may be used herein, in some aspects, in relation to the "content of an element" in a material or in a layer to describe the volume percentage of that element over a total volume of the material (or of the layer). The term "content" may be used herein in relation to the "content of defects" in the structure of a material to describe the volume percentage of the defects over a total volume of the structure.

The expression "a material of a layer", for example "a material of an electrode layer" or "a material of a functional layer", may be used herein to describe a main component of that layer, e.g. a main material (for example, a main element or a main compound) present in that layer. The term "a material of a layer" may describe, in some aspects, the material of that layer having a weight percentage greater than 60% over the total weight of the materials that the layer includes. The term "a material of a layer" may describe, in some aspects, the material of that layer having a volume percentage greater than 60% over the total volume of the materials that the layer includes. As an example, a material of a layer including aluminum may describe that that layer is formed mostly by aluminum, and that other elements (e.g., impurities) may be present in a smaller proportion, e.g. having less weight percentage or less volume percentage compared to aluminum. As another example, a material of a layer including titanium nitride may describe that that layer is formed mostly by titanium nitride, and that other elements (e.g., impurities) may be present in a smaller proportion, e.g. having less weight percentage or less volume percentage compared to titanium nitride.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a first electrode;
a second electrode; and
a memory structure disposed between the first electrode and the second electrode,
the first electrode, the second electrode, and the memory structure forming a memory capacitor, wherein at least one of the first electrode or the second electrode comprises a plurality of layers comprising:
a first electrode layer in direct contact with the memory structure, wherein the first electrode layer comprises a first material having a first microstructure comprising a first average grain size;
a functional layer in direct contact with the first electrode layer; and
a second electrode layer in direct contact with the functional layer, the second electrode layer contacting, from among the plurality of layers, only the functional layer, wherein the second electrode layer comprises a second material having a second microstructure different from the first microstructure for reducing a leakage current of the memory capacitor, wherein the second microstructure comprises a second average grainsize that differs from the first average grain size, a second crystallographic texture that differs from the second crystallographic texture, and a second grain size distribution that differs from the second grain size distribution, wherein the first electrode layer, the functional layer, and the second electrode layer form a planar electrode layer stack of the memory capacitor, wherein the functional layer is disposed between the first layer and the second layer in the planar electrode layer stack.

2. The memory cell according to claim 1, wherein the first microstructure further differs from the second microstructure in at least one of: granularity, grain size distribution, number of grain boundaries, spatial density of grain boundaries, shape of grain boundaries, chemical composition of grain boundaries, regions between two adjacent grains, content of defects, type of defects, crystallographic texture, and/or chemical composition of defects.

3. The memory cell according to claim 1, wherein the first material of the first electrode layer has a first weight percentage of oxygen, and a second material of the second electrode layer has a second weight percentage of oxygen different from the first weight percentage of oxygen.

4. The memory cell according to claim 1, wherein the first material of the first electrode layer has a first crystal structure and the second material of the second electrode layer has a second crystal structure different from the first crystal structure.

5. The memory cell according to claim 1, wherein the first material of the first electrode layer comprises at least one of: Platinum, Tantalum, Indium, Iridium, Rhenium, Rhodium, Ruthenium, Titanium, Osmium, Molybdenum, Chromium, Tungsten, Aluminum, Cobalt.

6. The memory cell according to claim 1, wherein the first electrode layer has a first thickness and the second electrode layer has a second thickness different from the first thickness.

7. The memory cell according to claim 1, wherein the first electrode layer has a first electrical conductivity, the second electrode layer has a second electrical conductivity different from the first electrical conductivity.

8. The memory cell according to claim 1, wherein the functional layer is an oxygen absorbing layer or an oxygen diffusion barrier layer.

9. The memory cell according to claim 1, wherein the first electrode layer comprises a first rate of diffusion of oxygen and the second electrode layer comprises a second rate of diffusion of oxygen different from the first rate of diffusion of oxygen.

10. The memory cell according to claim 1, wherein the at least one of the first electrode and the second electrode further comprises a second functional layer in direct contact with the second electrode layer; and a third electrode layer in direct contact with the second functional layer, the third electrode layer having a third microstructure different from the second microstructure and from the first microstructure.

11. The memory cell according to claim 1, wherein the memory structure comprises one or more remanent polarizable layers.

12. A memory cell comprising:
a first electrode;
a second electrode; and
a memory structure disposed between the first electrode and the second electrode, the first electrode, the second electrode, and the memory structure forming a memory capacitor, wherein at least one of the first electrode or the second electrode comprises:
a first electrode layer in direct contact with the memory structure, wherein the first electrode layer comprises a first electrical conductivity;
a functional layer in direct contact with the first electrode layer; and
a second electrode layer in direct contact with the functional layer, wherein the functional layer comprises a monolayer of an electrically insulating material interposed between the first electrode layer and the second electrode layer, wherein the second electrode layer has a second electrical conductivity less than the first electrical conductivity for reducing a leakage current of the memory capacitor, wherein the functional layer is disposed between the first electrode layer and the second electrode layer, and wherein the first electrode layer is not in direct contact with the second electrode layer.

13. The memory cell according to claim 12, wherein the first electrical conductivity is at least two times greater than the second electrical conductivity.

14. The memory cell according to claim 12, wherein the functional layer has the same lateral dimension as the first electrode layer and as the second electrode layer.

15. The memory cell according to claim 1, the memory cell further comprising:
a field-effect transistor structure comprising a gate electrode, wherein the gate electrode is electrically conductively connected to either the first electrode or the second electrode of the memory capacitor.

16. The memory cell according to claim 15, wherein the gate electrode comprises a conductive layer at a floating gate node of the field-effect transistor structure, wherein the gate electrode is electrically conductively connected to the second electrode layer of the memory capacitor at the floating gate node.

17. The memory cell according to claim 16, the memory cell further comprising:
an intermediate conductive structure that electrically conductively connects the conductive layer of the floating gate node to the second electrode layer of the memory capacitor.

18. The memory cell according to claim 1, wherein the functional layer comprises a monolayer of an electrically insulating material interposed between the first electrode layer and the second electrode layer.

* * * * *